United States Patent
Tanaka

(10) Patent No.: US 10,167,187 B2
(45) Date of Patent: Jan. 1, 2019

(54) PHYSICAL QUANTITY SENSOR HAVING AN ELONGATED GROOVE, AND MANUFACTURING METHOD THEREOF

(71) Applicant: Seiko Epson Corporation, Tokyo (JP)

(72) Inventor: Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 245 days.

(21) Appl. No.: 14/326,866

(22) Filed: Jul. 9, 2014

(65) Prior Publication Data

US 2015/0014799 A1   Jan. 15, 2015

(30) Foreign Application Priority Data

Jul. 9, 2013   (JP) .................................. 2013-143286
Apr. 23, 2014   (JP) .................................. 2014-088894
Apr. 23, 2014   (JP) .................................. 2014-088898

(51) Int. Cl.
*B81B 3/00* (2006.01)

(52) U.S. Cl.
CPC .... *B81B 3/0072* (2013.01); *B81B 2203/0109* (2013.01)

(58) Field of Classification Search
CPC ........................... B81B 3/0067; B81B 3/0072
USPC .................................................... 399/514.16
See application file for complete search history.

(56) References Cited

U.S. PATENT DOCUMENTS

| 5,987,989 | A | 11/1999 | Yamamoto et al. |
| 6,240,782 | B1 | 6/2001 | Kato et al. |
| 2008/0236292 | A1* | 10/2008 | Reijs ................ B81B 3/0072 73/727 |
| 2010/0064808 | A1* | 3/2010 | Nakatani ............ B81C 3/004 73/514.33 |
| 2010/0300205 | A1 | 12/2010 | Kazama et al. |
| 2013/0049212 | A1* | 2/2013 | Hata ................ G01C 19/5762 257/773 |

FOREIGN PATENT DOCUMENTS

| JP | 09-211022 | 8/1997 |
| JP | 2005-134155 A | 5/2005 |
| JP | 2007-279056 A | 10/2007 |
| JP | 2008-185369 A | 8/2008 |
| JP | 2009-014488 A | 1/2009 |
| JP | 2009-224462 A | 10/2009 |
| JP | 2010-139495 A | 6/2010 |
| JP | 2010-276508 A | 12/2010 |
| JP | 2013-019906 | 1/2013 |
| JP | 2013-525797 A | 6/2013 |
| JP | 2013-529300 A | 7/2013 |
| JP | 2013-532273 A | 8/2013 |
| JP | 2013-533461 A | 8/2013 |

* cited by examiner

*Primary Examiner* — Walter L Lindsay, Jr.
*Assistant Examiner* — Philip Marcus T Fadul
(74) *Attorney, Agent, or Firm* — Harness, Dickey & Pierce, P.L.C.

(57) ABSTRACT

A physical quantity sensor includes a first sensor element, and an outer edge portion arranged in at least part of the outer periphery of the first sensor element, and a first groove extending in a first direction provided in the outer edge portion in a plan view of the outer edge portion.

20 Claims, 11 Drawing Sheets

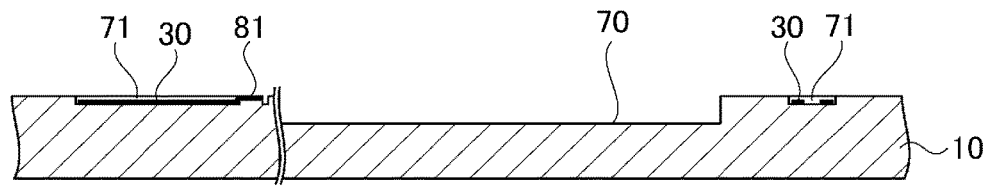
FIG. 5A
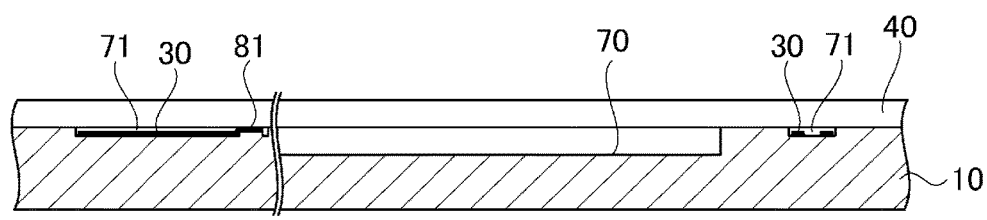
FIG. 5B
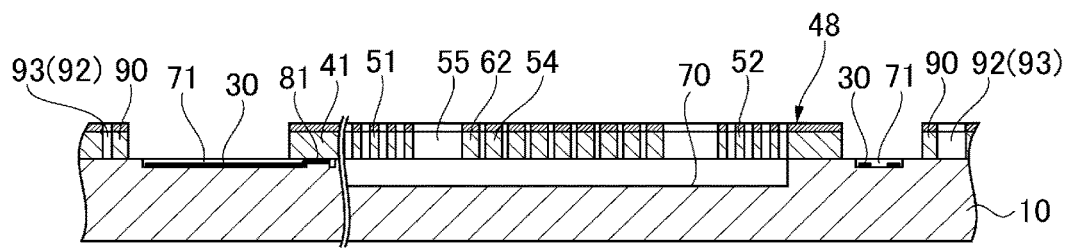
FIG. 5C
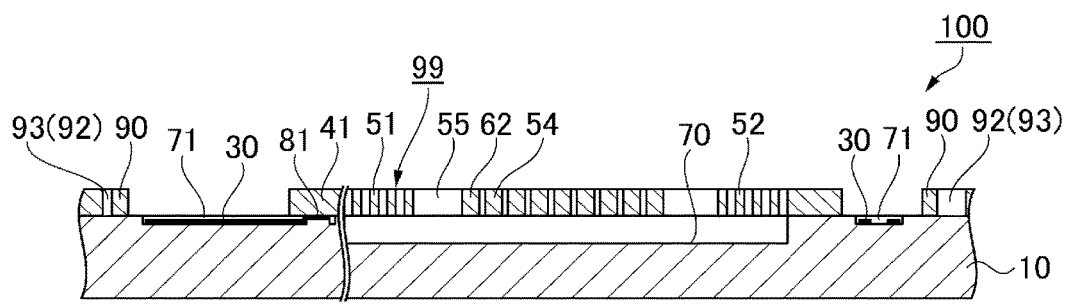
FIG. 5D
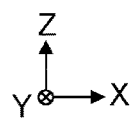

PHYSICAL QUANTITY SENSOR HAVING AN ELONGATED GROOVE, AND MANUFACTURING METHOD THEREOF

BACKGROUND

1. Technical Field

The present invention relates to an electronic device, a method of manufacturing an electronic device, a physical quantity sensor, an electronic apparatus, and a moving object.

2. Related Art

In general, a physical quantity sensor is a known type of an electromechanical structure provided with a mechanically movable structure. Examples of known physical quantity sensors include, for example, a capacitance sensor configured to detect a physical quantity (acceleration, angular speed and the like) on the basis of an electrostatic capacity between a movable electrode configured to be displaced in accordance with an action of the physical quantity and a fixed electrode opposing the movable electrode (for example, the semiconductor dynamic sensor described in JP-A-9-211022). The semiconductor dynamic sensor described above includes, for example, a substrate, and a sensor element (fixed electrode, fixed portion (anchor portion), a supporting portion extending from the fixed portion, a movable electrode supported by the supporting portion in a manner floating from the substrate) provided on the substrate. The sensor element is obtained by, for example, performing precision machining such as photo-etching on a semiconductor substrate (such as silicon substrate) bonded to a substrate (such as a glass substrate).

In the capacitance sensor described above, a parasitic capacitance formed in the configuration of the sensor element may lower the sensitivity of the sensor. In contrast, in the semiconductor dynamic sensor described in JP-A-2007-279056, a technology to provide a device (shield electrode) for fixing the potential of an outer peripheral portion arranged on an outer periphery of the sensor element to prevent lowering of the sensor sensitiveness is proposed.

However, with the physical quantity sensor provided with the outer peripheral portion on the outer periphery of the sensor element as the semiconductor dynamic sensor described in JP-A-2007-279056, a detection property of the sensor may vary depending on a temperature of the environment where the sensor is used. Specifically, the problem is that leaked vibrations or a leaked force from a disturbance or the like transmitted from the outer peripheral portion to the movable portion (movable electrode) of the sensor element may affect the displacement of the movable portion (movable electrode) and may vary the detection property.

SUMMARY

An advantage of some aspects of the invention is to solve at least a part of the problems described above, and the invention can be implemented as the following application examples or forms.

APPLICATION EXAMPLE 1

An electronic device according to this application example includes: a first functional element; and an outer edge portion arranged on at least part of an outer periphery of the first functional element, wherein the outer edge portion includes a first groove extending (is elongated) in a first direction formed in the outer edge portion when viewing the outer edge portion in plan view. Also, the first groove is empty/open such that it is vacant of fill material, wiring, and the like.

According to this application example, the electronic device includes the first functional element and the outer edge portion arranged on the outer periphery (the outer periphery when viewing the electronic device in plan view) of the first functional element. The outer edge portion includes the first groove extending in the first direction. In this configuration, the outer edge portion is provided with the first groove formed thereon, for example, so that transmission of leaked vibrations or a leaked force from disturbance or the like transmitted from the outer edge portion to the first functional element is alleviated by the first groove. Therefore, an electronic device stable in electric property, in which variations in electric property due to leaked vibrations and a leaked force from disturbance or the like transmitted from the outside to the first functional element is reduced, is provided.

APPLICATION EXAMPLE 2

In the electronic device according to the application example described above, it is preferable that the outer edge portion is provided with a second groove extending (is elongated) in a second direction which intersects the first direction when viewing the outer edge portion in plan view. As with the first groove, the second groove is empty/open such that it is vacant of fill material, wiring, and the like.

According to this application example, the electronic device includes the second groove extending in the second direction which intersects the first direction in addition to the first groove extending in the first direction in the outer edge portion of the first functional element. The leaked vibrations and a leaked force from disturbance or the like transmitted from the outer edge portion to the first functional element is decomposed into a vector component in either the first direction or the second direction which intersects the first direction. With the provision of the first groove and the second groove as Application Example 2, transmission of a stress applying on the groove in a direction which intersects the direction of extension of the grove is alleviated by the groove. Therefore, an electronic device stable in electric property, in which variations in electric property due to leaked vibrations and a leaked force from disturbance or the like transmitted from the outside to the first functional element is reduced, is provided.

APPLICATION EXAMPLE 3

In the electronic device according to the application example described above, it is preferable that the first functional element includes a fixed portion, a supporting portion extending from the fixed portion, and a movable portion supported by the supporting portion so as to be displaceable.

According to this application example, the electronic device includes at least one of the first groove and the second groove in the outer edge portion arranged on the outer periphery of the first functional element. Therefore, even when the first functional element includes the movable portion (movable electrode), and leaked vibrations and a leaked force from disturbance or the like transmitted to the movable portion (movable electrode) of the first functional element are generated in the outer edge portion, the leaked vibrations and the leaked force are alleviated by at least one of the first groove and the second groove, so that the influence on the displacement of the movable portion is reduced and variations in electric property of the first functional element are reduced. According to Application Example 3, in the electronic device provided with the movable portion, variations in electric property are reduced and a stable electric property is achieved.

APPLICATION EXAMPLE 4

In the electronic device according to the application example described above, it is preferable that the electronic device includes a second functional element, and the first groove is provided between the first functional element and the second functional element.

According to this application example, the electronic device further includes the second functional element in addition to the first functional element. The electronic device includes the first groove and the second groove in at least one of an insulated portion in an area between the first functional element and the second functional element and an area overlapped with the outer edge portion of the substrate. Therefore, transmission of energy such as a stress applied between the first functional element and the second functional element or leaked vibrations transmitted from one of the first functional element and the second functional element to the other is alleviated by at least one of the first groove and the second groove, and the influence on the property is reduced. More Specifically, deterioration of the electric property of the electronic device caused by so-called mutual vibration interference among a plurality of functional elements, such that a noise generated by one of a plurality of functional elements affects another functional element, when the electronic device includes a plurality of functional elements may be restrained. The noise may be caused not only by electrically factors, but also by leaked vibrations and a leaked force from disturbance or the like or mechanical energy such as vibrations. More specifically, examples of the noise include thermal stress or residual stress that a structure of the functional element generates or has and, if the movable portion is provided, vibration leakage transmitted to an adjacent functional element is included (the same applies to the "noise" described in the following description, so that the description is omitted in the following description).

APPLICATION EXAMPLE 5

In the electronic device according to the application example described above, it is preferable that the first functional element is provided on a main surface of the substrate, and the first groove is provided on at least one of the outer edge portion and an area of the substrate overlapping with the outer edge portion in plan view of the substrate.

According to this application example, the electronic device includes the substrate, the first functional element and the outer edge portion arranged on the outer periphery (the outer periphery when viewing the substrate in plan view) of the first functional element. In addition, the first groove extending in the first direction is formed in at least one of the outer edge portion and the area of the substrate overlapping with the outer edge portion. In this configuration, the outer edge portion is provided with the first groove, for example, so that transmission of leaked vibrations and a leaked force from disturbance or the like transmitted from the outer edge portion to the first functional element is alleviated by the first groove. Therefore, an electronic device stable in electric property, in which variations in electric property due to leaked vibrations and a leaked force from disturbance or the like or variations in electric property due to a temperature change of the environment of usage transmitted from the outside to the first functional element is reduced, is provided.

In particular, the thermal stress generated between the substrate and the outer edge portion on the main surface of the substrate is also alleviated by the first groove. For example, in a case where the substrate is warped by the thermal stress, the warp is alleviated by the first groove. Consequently, deformation of the first functional element caused by the thermal stress generated by a difference in coefficient of thermal expansion and, when the first functional element is provided with the movable portion (movable electrode), an influence on the displacement thereof are alleviated, so that variations in detection property caused by the temperature change in the environment of usage are reduced. In other words, according to Application Example 5, an electronic device stable in electric property, in which variations in electric property due to a temperature change of the environment of usage are reduced while blocking or reducing a leakage of a signal detected by the first functional element, is provided.

APPLICATION EXAMPLE 6

In the electronic device according to the application example described above, it is preferable that the second groove is provided on at least one of the outer edge portion and an area of the substrate overlapping with the outer edge portion in plan view of the substrate.

According to this application example, the electronic device includes the second groove extending in the second direction which intersects the first direction in addition to the first groove extending in the first direction on at least one of the outer edge portion of the first functional element and the area of the overlapping with the outer edge portion of the substrate. In this configuration, the outer edge portion has, for example, an effect of blocking or reducing a leakage of a signal that the first functional element detects or a noise exerted to the first functional element from the outside. With the provision of the first groove and the second groove in at least one of the outer edge portion or the area of the substrate overlapping with the outer edge portion as Application Example 6, a thermal stress generated when the outer edge portion has a coefficient of thermal expansion different from the coefficient of thermal expansion of the substrate is alleviated by either one of these grooves. Therefore, the outer periphery of the first functional element may be surrounded over a wide area.

Specifically, a stress generated in the direction of extension of a plane is decomposed into vector components at least in the first direction or the second direction which intersects the first direction. Transmission of the stress acting in the direction which intersects the direction of extension of the groove is alleviated by the groove. Therefore, the thermal stress generated between the substrate and the outer edge portion on the main surface of the substrate is also alleviated by either one of these grooves. For example, in a case where the substrate is warped by thermal stress, the warp is alleviated by these grooves. Consequently, deformation of the first functional element caused by the thermal stress generated by a difference in coefficient of thermal expansion and, when the first functional element is provided with the movable portion (movable electrode), an influence on the displacement thereof are alleviated, so that variations in detection property caused by the temperature change in the environment of usage are reduced. In other words, according to Application Example 6, an electronic device stable in electric property, in which variations in electric property due to a temperature change of the environment of usage are reduced while blocking or reducing a leakage of a signal detected by the first functional element or a noise exerted to the first functional element from the outside, is provided.

APPLICATION EXAMPLE 7

In the electronic device according to the application example described above, it is preferable that the first functional element and the outer edge portion are formed of the same material.

According to this application example, since the first functional element and the outer edge portion are formed of the same material, the first functional element and the outer edge portion can be formed in the same process, so that manufacture is simplified.

APPLICATION EXAMPLE 8

In the electronic device according to the application example described above, it is preferable that the fixed portion is fixed on the main surface of the substrate, and the movable portion is supported by the supporting portion so as to be displaceable in a manner floating from the substrate.

According to this application example, the outer edge portion arranged on the outer periphery of the first functional element supported by the substrate via the supporting portion includes the first groove and the second groove. Therefore, even when the first functional element includes the movable portion (movable electrode), and a thermal stress or deformation or the like due to the thermal stress is generated, the warp or thermal stress is alleviated by at least one of the first groove and the second groove, so that the influence on the displacement of the movable portion is reduced, and variations in electric property caused by the temperature change in the environment where the first functional element is used are reduced. According to Application Example 8, in the electronic device provided with the movable portion, variations in electric property due to the temperature change in the environment of usage are reduced and a stable electric property is achieved.

APPLICATION EXAMPLE 9

In the electronic device according to the application example described above, it is preferable that the second functional element is provided on the main surface of the substrate, and at least one of the first groove and the second groove is provided between the first functional element and the second functional element.

According to this application example, the electronic device is provided further with the second functional element in addition to the first functional element provided on the main surface of the substrate. The electronic device includes the first groove and the second groove in at least one of an insulated portion in an area between the first functional element and the second functional element and an area overlapped with the outer edge portion of the substrate. Therefore, transmission of energy such as a stress applied between the first functional element and the second functional element or leaked vibrations transmitted from one to the other is alleviated by at least one of the first groove and the second groove, and the influence on the property is reduced. More Specifically, deterioration of the electric property of the electronic device caused by an influence of the noise generated by one of the functional elements to the other functional element when a plurality of the functional elements are provided on a common substrate may be reduced.

APPLICATION EXAMPLE 10

In the electronic device according to the application example described above, it is preferable that the first direction is a direction of displacement of the movable portion of the first functional element in plan view.

According to this application example, the first direction is the direction of displacement of the movable portion provided on the first functional element (the direction of displacement in plan view of the substrate). In other words, the outer edge portion arranged on the outer periphery of the first functional element includes the first groove extending in the same direction as the direction of displacement of the movable portion provided on the first functional element and the second groove extending in the direction which intersects the direction of displacement of the movable portion provided on the first functional element in plan view of the first functional element. Since the outer edge portion is provided with the second groove extending in the direction which intersects the direction of displacement of the movable portion provided on the first functional element, transmission of the leaked vibrations and a leaked force from disturbance or the like from the outer edge portion to the movable portion (movable electrode) of the first functional element may be reduced by the first groove or the second groove. Accordingly, an electronic device stable in electric property, in which variations in electric property due to leaked vibrations and a leaked force from disturbance or the like transmitted from the outside to the first functional element are reduced while blocking or reducing a leakage of a signal detected by the first functional element or a noise exerted to the first functional element from the outside, is provided.

When the outer edge portion has a coefficient of thermal expansion different from the coefficient of thermal expansion of the substrate, the outer edge portion includes the second groove extending in the direction which intersects the direction of displacement of the movable portion provided on the first functional element. Therefore, the thermal stress generated in the direction of displacement of the movable portion by the second groove can be alleviated further effectively. In particular, the thermal stress is alleviated more effectively when the second groove extends so as to intersect the direction of displacement of the movable portion at a right angle. With the provision of the first groove in the outer edge portion, the thermal stress that the substrate receives from the outer edge portion is reduced. More specifically, with the provision of the first groove, which extends in the direction of displacement of the movable portion provided on the first functional element, in the outer edge portion, a joint area between the substrate and the outer edge portion is reduced, and hence thermal stress generated in the direction of displacement of the movable portion that the substrate receives from the outer edge portion is reduced. Consequently, deformation of the first functional element caused by the thermal stress generated by a difference in coefficient of thermal expansion and, when the first functional element is provided with the movable portion (movable electrode), an influence on the displacement thereof are alleviated. Accordingly, variations in electric property of the electronic device caused by the temperature change of the environment in which the first functional element is used are reduced.

APPLICATION EXAMPLE 11

In the electronic device according to the application example described above, it is preferable that the first groove and the second groove are arranged to form a figure which has rotational symmetry in plan view of the first functional element.

According to this application example, with the arrangement of the first groove and the second groove so as to form the figure which has rotational symmetry in plan view of the first functional element, transmission of the leaked vibrations and a leaked force from disturbance or the like from the outer edge portion to the movable portion (movable electrode) of the first functional element may be reduced further effectively and the variations in detection property due to the temperature change may be reduced more effectively.

Specifically, the first groove and the second groove, which are capable of alleviating an external stress or the thermal stress, are arranged so that the figure formed thereby has rotational symmetry in plan view of the first functional element. In other words, the effect of alleviating the external stress or thermal stress is balanced at least between the areas overlapped with rotational symmetry. Therefore, even though a warp or the like is generated in the substrate, for example, an unintended distortion caused by an unbalanced stress is alleviated, so that the stress is alleviated further stably. The phrase arranged so as to have rotational symmetry means to be arranged so as to have rotational symmetry n+1 times, where n is a natural number.

APPLICATION EXAMPLE 12

In the electronic device according to the application example described above, it is preferable that the first groove penetrates through the outer edge portion or the substrate in a thickness direction of the first functional element.

With the provision of the first groove and the second groove, or the first groove or the second groove so as to penetrate through the outer edge portion or the substrate in the thickness direction of the first functional element as in this application example, variations in detection property due to the temperature change may be reduced further effectively. Specifically, for example, in the stress alleviating effect described above, the groove (the first groove and the second groove, or the first groove or the second groove) which alleviates the stress is formed as a groove penetrating through the outer edge portion or the substrate. Therefore, there is no outer edge portion or the substrate remaining as a bottom portion of the groove (residual bottom portion) and hence a stress transmitted in the residual bottom portion is eliminated. By forming the groove so as to penetrate, the joint area between the substrate and the outer edge portion is reduced, and hence the magnitude of the thermal stress itself generated by the difference in coefficient of thermal expansion between the substrate and the outer edge portion may further be reduced. Consequently, the thermal stress may be effectively alleviated, and variations in electric property of the electronic device due to the temperature change may be reduced.

APPLICATION EXAMPLE 13

In the electronic device according to the application example described above, it is preferable that the outer edge portion is a fixed potential.

According to this application example, since the outer edge portion is formed of the fixed potential, a shielding effect may be obtained more effectively.

APPLICATION EXAMPLE 14

A method of manufacturing an electronic device according to this application example includes forming a depressed portion on a substrate, joining a functional element substrate with the substrate so as to oppose the depressed portion, and performing patterning on the functional element substrate to form a functional element, an outer edge portion, a first groove provided in the outer edge portion and extending in a first direction, and a second groove extending in a second direction which intersects the first direction.

According to this application example, the functional element substrate is joined to the substrate so as to oppose the depressed portion, then patterning is performed on the functional element substrate to form a functional element, an outer edge portion, a first groove provided in the outer edge portion and extending in a first direction, and a second groove extending in a second direction which intersects the first direction. In this manner, the functional element, the outer edge portion, the first groove, and the second groove may be formed from the functional element substrate joined to the substrate in the same process. In other words, the functional element, the outer edge portion, the first groove, and the second groove may be formed easily.

APPLICATION EXAMPLE 15

A physical quantity sensor according to this application example includes a first sensor element, and an outer edge portion arranged at least part of the outer periphery of the first sensor element, and a first groove extending in a first direction is provided in the outer edge portion in plan view of the outer edge portion.

According to this application example, the physical quantity sensor includes the first sensor element, and the outer edge portion arranged on an outer periphery of the first sensor element (outer periphery in plan view of the substrate). The outer edge portion includes the first groove extending in the first direction. In this configuration, the outer edge portion may be configured as a shield electrode having an effect of blocking or reducing a leakage of a signal that the first sensor element detects or a noise exerted to the first sensor element from the outside, for example. When configuring the outer edge portion as the shield electrode, surrounding the outer periphery of the first sensor element over a wider area is further effective. As in Application Example 15, with the provision of the first groove in the outer edge portion in the first direction, transmission of leaked vibrations and a leaked force from disturbance or the like transmitted from the outer edge portion to the first sensor element is alleviated by the first groove. Therefore, the outer periphery of the first sensor element may be surrounded over a wide area. In this configuration, a physical quantity sensor stable in electric property, in which variations in electric property due to leaked vibrations and a leaked force from disturbance or the like transmitted from the outside to the first sensor element are reduced, is provided.

APPLICATION EXAMPLE 16

In the physical quantity sensor according to the application example described above, it is preferable that the outer edge portion is provided with a second groove extending in a second direction which intersects the first direction when viewing the outer edge portion in plan view.

According to this application example, the physical quantity sensor includes the second groove extending in the second direction which intersects the first direction in addition to the first groove extending in the first direction in the outer edge portion of the first sensor element. The leaked vibrations and a leaked force from disturbance or the like transmitted from the outer edge portion to the first sensor element is decomposed into a vector component in either the first direction or the second direction which intersects the first direction. With the provision of the first groove extending in the first direction and the second groove extending in the second direction which intersects the first direction as Application Example 16, transmission of a stress applying on the groove in a direction which intersects the direction of extension of the grove is alleviated by the groove. Therefore, a physical quantity sensor stable in electric property, in which variations in electric property due to leaked vibrations and a leaked force from disturbance or the like transmitted from the outside to the first sensor element are reduced, is provided.

APPLICATION EXAMPLE 17

In the physical quantity sensor according to the application example described above, it is preferable that the physical quantity sensor includes a second sensor element, and at least one of first groove and the second groove is provided between the first sensor element and the second sensor element.

According to this application example, the physical quantity sensor further includes the second sensor element in addition to the first sensor element. The physical quantity sensor is provided with the first groove and the second groove in an insulated portion in an area between the first sensor element and the second sensor element. Therefore, transmission of energy such as a stress applied between the first sensor element and the second sensor element or leaked vibrations transmitted from one of the first sensor element and the second sensor element to the other is alleviated by at least one of the first groove and the second groove, and the influence on the property is reduced. More Specifically, deterioration of the electric property of the physical quantity sensor caused by so-called mutual vibration interference among a plurality of sensor elements, such that a noise generated by one of a plurality of sensor elements affects another sensor element, in a case where the physical quantity sensor includes a plurality of sensor elements may be restrained.

APPLICATION EXAMPLE 18

In the physical quantity sensor according to the application example described above, it is preferable that the first sensor element is provided on a main surface of the substrate, and the first groove is provided on at least one of the outer edge portion and an area of the substrate overlapping with the outer edge portion in plan view of the substrate.

According to this application example, the physical quantity sensor includes the substrate, the first sensor element provided on the main surface of the substrate, and the outer edge portion arranged on an outer periphery of the first sensor element (outer periphery in plan view of the substrate). In addition, the first groove extending in the first direction is formed in at least one of the outer edge portion and the area of the substrate overlapping with the outer edge portion. In this configuration, the edge portion is provided with the first groove formed thereon, for example, so that transmission of leaked vibrations and a leaked force from disturbance or the like transmitted from the outer edge portion to the first functional element is alleviated by the first groove. Therefore, an electronic device stable in electric property, in which variations in electric property due to leaked vibrations and a leaked force from disturbance or the like or variations in electric property due to a temperature change of the environment of usage transmitted from the outside to the first functional element are reduced, is provided.

APPLICATION EXAMPLE 19

In the physical quantity sensor according to the application example described above, it is preferable that the second groove extending in the second direction is provided on at least one of the outer edge portion and an area of the substrate overlapping with the outer edge portion in plan view of the substrate.

According to this application example, the physical quantity sensor includes the second groove extending in the second direction which intersects the first direction in addition to the first groove extending in the first direction on at least one of the outer edge portion of the first sensor element and the area of the substrate overlapping with the outer edge portion. In this configuration, the outer edge portion may block or reduce a leakage of a signal that the first sensor element detects or a noise exerted to the first sensor element from the outside, for example. With the provision of the first groove and the second groove in at least one of the outer edge portion or the area of the substrate overlapping with the outer edge portion as Application Example 19, a thermal stress generated when the outer edge portion has a coefficient of thermal expansion different from the coefficient of thermal expansion of the substrate is alleviated by either one of these grooves.

APPLICATION EXAMPLE 20

In the physical quantity sensor according to the Application example described above, it is preferable that the physical quantity sensor includes a second sensor element provided on the main surface of the substrate and the first groove is provided between the first sensor element and the second sensor element.

According to this application example, transmission of energy such as a stress applied between the first sensor element and the second sensor element or leaked vibrations transmitted from one to the other is alleviated by the first groove and the second groove, or at least one of the grooves, and the influence on the detection property of the physical quantity sensor is restrained. More Specifically, deterioration of the detection property of the physical quantity sensor caused by an influence of the noise generated by one of the sensor elements to the other sensor element when a plurality of the sensor elements are provided on a common substrate may be reduced.

APPLICATION EXAMPLE 21

An electronic apparatus according to this application example includes the electronic device according to the application example described above.

According to this application example, with the provision of the electronic device in which variations in detection property due to the temperature change in the environment of usage are reduced and hence a more stable detection property is achieved, an electronic apparatus with a more stable temperature property is provided as the electronic apparatus.

APPLICATION EXAMPLE 22

A moving object according to this application example includes the electronic device according to the application example described above.

According to this application example, with the provision of the electronic device in which variations in detection property due to the temperature change in the environment of usage are reduced and hence a more stable detection property is achieved, a moving object with a more stable environment property such as the temperature change is provided as the moving object.

BRIEF DESCRIPTION OF DRAWINGS

Embodiments of the invention will be described with reference to the accompanying drawings, wherein like numbers reference like elements.

FIGS. 5A to 5D are cross-sectional front views schematically illustrating a method of manufacturing the physical quantity sensor according to the second embodiment.

DESCRIPTION OF EXEMPLARY EMBODIMENTS

With reference to the drawings, embodiments of the invention will be described. Given below is embodiment of the invention and is not intended to limit the invention. The respective drawings may be shown in scales different from actual scales for easy understanding of the description.

First Embodiment

Figure 1A:
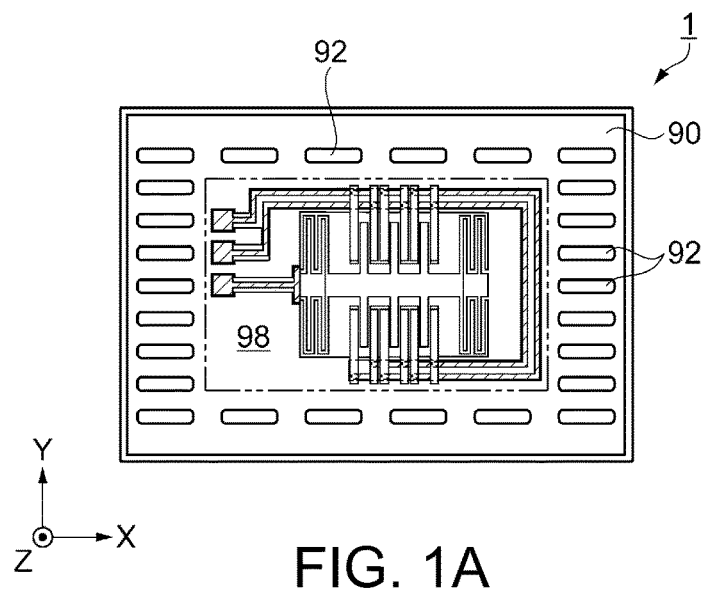
FIGS. 1A to 1C are schematic drawings illustrating a physical quantity sensor of an electronic device according to a first embodiment.
Figure 1B:
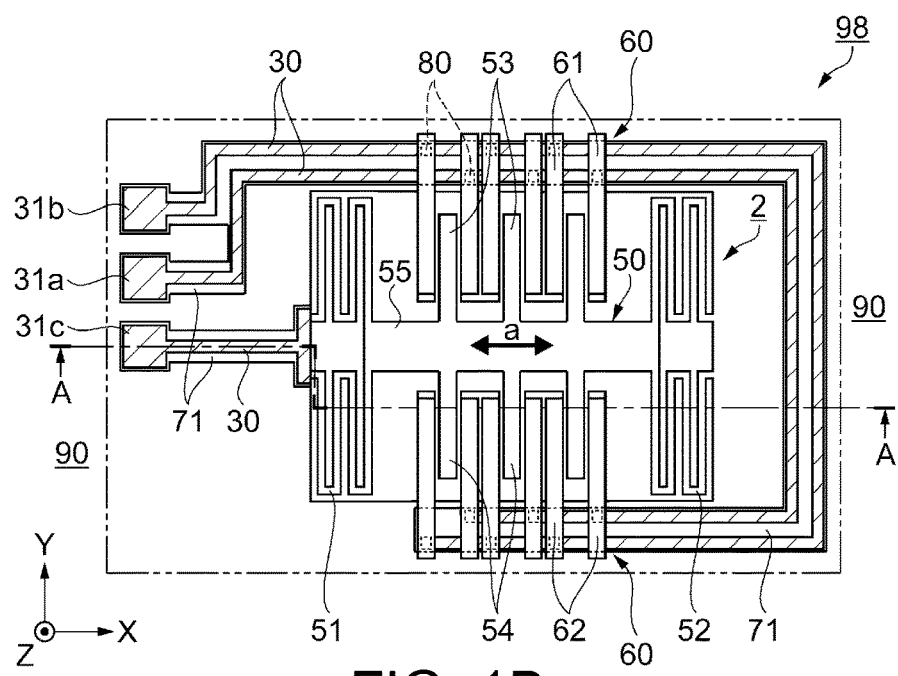
Figure 1C:
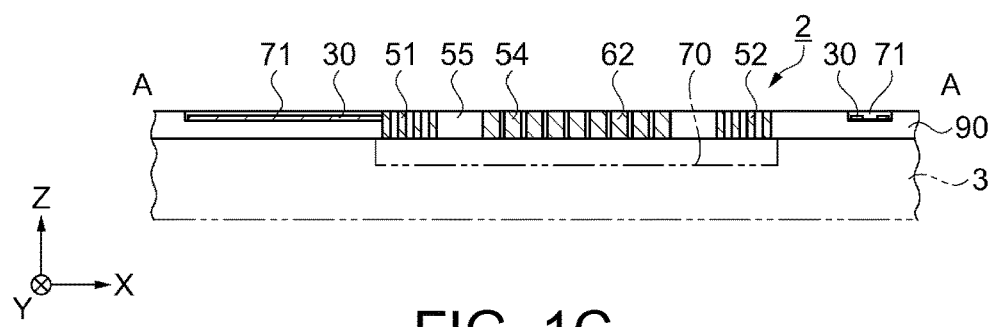

First of all, a physical quantity sensor of an electronic device according to a first embodiment will be described. FIGS. 1A to 1C are schematic drawings illustrating a physical quantity sensor of the electronic device according to a first embodiment. FIG. 1A is a plan view, and FIG. 1B is a plan view of a first sensor element as a sensor portion provided on the physical quantity sensor, and FIG. 1C is a cross-sectional view taken along the line A-A in FIG. 1B. In the following example, description will be given with an X-direction as a rightward direction, an X-axis direction (±X direction) as a lateral direction, a Y-direction as a depth direction, a Y-axis direction (±Y direction) as a fore-and-aft direction, a Z-direction corresponds to an upward direction, and Z-axis direction (±Z direction) as a vertical direction in XYZ axes shown in the drawings for the sake of convenience of explanation.

Configuration of Physical Quantity Sensor

A physical quantity sensor 1 includes a first sensor element (first functional element) 98 as a sensor portion, and an outer edge portion 90. The first sensor element 98 includes a sensing portion 2 and wiring 30. The sensing portion 2 includes a movable electrode 50 as a movable portion, and a fixed electrode 60. The movable electrode 50 includes supporting portions 51 and 52, movable electrode fingers 53 and 54, and a movable base portion 55. The first sensor element (first functional element) 98 which constitutes the sensor portion and the outer edge portion 90 are formed of the same material. The configuration in which the first sensor element (first functional element) 98 and the outer edge portion 90 are formed of the same material allows easy formation of the physical quantity sensor 1 in comparison with a configuration in which the first sensor element (first functional element) 98 and the outer edge portion 90 are formed separately. The physical quantity sensor 1 may be joined to a plate-shaped substrate 3 as a joined member. The substrate 3 is provided with a depressed portion 70 on an upper surface as a main surface. The depressed portion 70 is preferably formed in an area where the movable electrode 50 of the sensing portion 2 (the supporting portions 51 and 52, the movable electrode fingers 53 and 54, and the movable base portion 55) is accommodated when in plan view of the first sensor element 98. The depressed portion 70 is preferably formed as a recessed portion for making the movable electrode 50 (the supporting portions 51 and 52, the movable electrode fingers 53 and 54, and the movable base portion 55) separate from the substrate 3.

The movable base portion 55 is a rectangular plate-shaped member oriented so that a longitudinal direction thereof extends in the X-direction, and is supported by the supporting portions 51 and 52 interposed between the movable base portion 55 and the outer edge portion 90. More specifically, a left end portion of the movable base portion 55 is coupled to the outer edge portion 90 via a supporting portion 51, and a right end portion of the movable base portion 55 is coupled to the outer edge portion 90 via a supporting portion 52.

A plurality of (three in this embodiment) beam-shaped movable electrode fingers 53 extend in a +Y direction from a long side portion of the movable base portion 55 on the +Y side, and a plurality of (three in this embodiment) beam-shaped movable electrode fingers 54 extend in a −Y direction from a long side portion of the movable base portion 55 on a −Y side.

The supporting portions 51 and 52 couple the movable base portion 55 so as to be displaceable with respect to the outer edge portion 90. In this embodiment, the supporting portions 51 and 52 are configured so as to be capable of displacing the movable base portion 55 in the X-axis direction as illustrated by an arrow a in FIG. 1B.

A plurality of movable electrode fingers 53 and a plurality of movable electrode fingers 54 extending in the Y-axis direction are arranged in the X-axis direction in which the movable electrode 50 is displaced.

The supporting portion 51 includes two (a pair of) beams which have a shape extending in the +X direction while meandering in the Y-axis direction, respectively. In other words, the respective beams have a shape turned over a plurality of times (three times in this embodiment) in the Y-axis direction. The number of times of turning over of each beam may be one, two, four or more.

In the same manner, the supporting portion 52 includes a pair of beams having a shape extending in the −X direction while meandering in the Y-axis direction, respectively.

The fixed electrode 60 includes a plurality of fixed electrode fingers 61 and 62 arranged so as to form combs meshing with a plurality of movable electrode fingers 53 and 54 of the movable electrode 50 at a distance.

The fixed electrode fingers 61 are arranged in pairs on both sides in the X-axis direction so as to interpose one movable electrode finger 53 therebetween at a distance. In other words, a pair of the fixed electrode fingers 61, that is, two fixed electrode fingers 61 are arranged at three positions. In the same manner, a pair each of fixed electrode fingers 62 are arranged in pairs on both sides in the X-axis direction so as to interpose one movable electrode finger 54 therebetween at a distance. In other words, a pair of the fixed electrode fingers 62, that is, two fixed electrode fingers 62 are arranged at three positions.

The fixed electrode fingers 61 and 62 are joined at one end of each thereof to areas of the first sensor element 98 (physical quantity sensor 1) in the outer edge portion 90 on a main surface of the first sensor element 98 in plan view of the first sensor element 98. Specifically, the fixed electrode fingers 61 are joined to the outer edge portion 90 side of the first sensor element 98 at ends thereof on the side opposite to the movable electrode 50 (+Y side with respect to the movable electrode 50). The fixed electrode fingers 61 each have a fixed end on the fixed side, and a free end extending in the −Y direction. In the same manner, the fixed electrode fingers 62 are joined to the outer edge portion 90 side of the first sensor element 98 at ends thereof on the side opposite to the movable electrode 50 (−Y side with respect to the movable electrode 50), and each have a fixed end on the fixed side, and a free end extending in the +Y direction.

In this configuration, an electrostatic capacity between the fixed electrode finger 61 positioned on the +X side of the movable electrode fingers 53 among the fixed electrode fingers 61 (hereinafter, referred to as first fixed electrode fingers) and the movable electrode fingers 53, and an electrostatic capacity between the fixed electrode fingers 61 positioned on the −X side of the movable electrode fingers 53 among the fixed electrode fingers 61 (hereinafter referred to as second fixed electrode fingers) and the movable electrode fingers 53 may be changed depending on the displacement of the movable electrode 50.

In the same manner, an electrostatic capacity between the fixed electrode finger 62 positioned on the +X side of the movable electrode fingers 54 among the fixed electrode fingers 62 (hereinafter, referred to as first fixed electrode fingers in the same manner) and the movable electrode fingers 54, and an electrostatic capacity between the fixed electrode fingers 62 positioned on the −X side of the movable electrode fingers 54 among the fixed electrode fingers 62 (hereinafter referred to as second fixed electrode fingers in the same manner) and the movable electrode fingers 54 may be changed depending on the displacement of the movable electrode 50.

The first fixed electrode fingers and the second fixed electrode fingers are separated from each other and electrically insulated. Therefore, the electrostatic capacity between the first fixed electrode fingers and the movable electrode 50 (the movable electrode fingers 53 and 54), and the electrostatic capacity between the second fixed electrode fingers and the movable electrode 50 (movable electrode fingers 53 and 54) are measured separately, whereby the physical quantity can be detected precisely on the basis of the measurement result.

In other words, in the sensing portion 2, for example, the movable electrode 50 (the movable electrode fingers 53 and 54) is displaced in the X-axis direction (+X direction or −X direction) while displacing the supporting portions 51 and 52 resiliently in accordance with the change of the physical quantity such as an acceleration or an angular speed. The first sensor element 98 is capable of detecting the physical quantity such as the acceleration or the angular speed on the basis of the electrostatic capacity changed in association with such a displacement. In other words, the first sensor element 98 is a capacity type acceleration sensor.

The shapes of the movable electrode 50 and the fixed electrode 60 are determined by the shapes or the sizes of the respective portions constituting the sensing portion 2, and are not limited to the configuration described above.

The wiring 30 is an electric connection wiring for detecting the electrostatic capacity described above, and is laid along a concave portion 71 formed on the main surface (the main surface of the first sensor element 98) of the physical quantity sensor 1. The wiring 30 includes wiring for connecting the first fixed electrode fingers and then connecting an electrode 31*a* that is to be connected to an external circuit, wiring for connecting the second fixed electrode fingers and then connecting an electrode 31*b* to be connected to the external circuit, and wiring to be connected to an electrode 31*c* for connecting the movable electrode 50 to the external circuit. An insulating layer may be provided between the wiring 30 and the concave portion 71. Examples of the insulating layer include silicon dioxide ($SiO_2$), for example. In other words, the wiring 30 and the outer edge portion 90 may be electrically insulated.

The concave portion 71 is provided as an area in which the wiring 30 is laid in an area in the outer edge portion 90 side of the first sensor element 98. In other words, the concave portion 71 is formed so that the area where the wiring 30 is laid is included in an area of the concave portion 71 in plan view of the first sensor element 98. The depth of the concave portion 71 (the dimension in the thickness direction of the first sensor element 98) is larger than the thickness of the wiring 30 except for a contact portion described later. Connection between the wiring 30 and the first and the second fixed electrode fingers is achieved by the contact portion 80.

The material of configuration of the wiring 30 is not specifically limited and various electrode materials can be used as long as the material has conductivity. For example, oxidized material such as ITO (Indium Tin Oxide), IZO (Indium Zinc Oxide), $In_2O_3$, $SnO_2$, SB containing $SnO_2$, Al containing ZnO (transparent electrode material), Au, Pt, Ag, Cu, Al or alloy including these materials, and one or more types may be combined.

The outer edge portion 90 has a function as a shield electrode having an effect of blocking or reducing a leakage of a signal that the first sensor element 98 detects or a noise exerted to the first sensor element 98 from the outside. The outer edge portion 90 is arranged on an outer peripheral area of the first sensor element 98 on the main surface of the physical quantity sensor 1 in plan view of the physical quantity sensor 1 as illustrated in FIG. 1A.

Specifically, the first sensor element 98 occupies a rectangular area in plan view at a center portion of the main surface of the physical quantity sensor 1. The outer edge portion 90 is formed into a frame shape so as to completely surround the first sensor element 98 at the center portion of the main surface of the physical quantity sensor 1. The outer edge portion 90 is provided with a fixed potential such as a ground potential by wiring or the like, for example. In this manner, by configuring the outer edge portion 90 as the fixed potential such as the ground potential, the outer edge portion 90 has an effect as the shield electrode.

The outer edge portion 90 also includes a plurality of first grooves 92 extending in the X-axis direction as the first direction in plan view of the physical quantity sensor 1. In other words, the first direction in which the first grooves 92 extend is a direction of displacement of the movable portion (that is, the movable electrode 50). The first grooves 92 are hole grooves (elongated through holes) penetrating from an upper surface to a lower surface of the outer edge portion 90, and the length in the X-axis direction is approximately 70% of the frame width of the outer edge portion 90 having a frame shape, and the width in the Y-axis direction is approximately 10% of the frame width of the outer edge portion 90. The first grooves 92 are arranged substantially equidistantly in an area of a frame of the outer edge portion 90. The size and the number of the first grooves 92 are not limited to those described above. For example, more of the first grooves 92 with reduced length and width may be arranged. However, attention should be paid in the configuration of the grooves so that the effect as the shield electrode is not impaired.

Silicon is used as a material which constitutes the physical quantity sensor 1 as a preferable example. In this manner, with the first sensor element 98 and the outer edge portion 90 formed of the same material, these members may be formed integrally by, for example, patterning on a single silicon substrate when manufacturing, so that simplification of manufacture is achieved.

The silicon substrate may be processed further precisely by etching. Therefore, superior dimensional accuracy of the sensing portion 2 or the like is achieved by forming the physical quantity sensor 1 mainly of the silicon substrate, and consequently, improved sensitivity of the first sensor element 98 is achieved.

The silicon material which constitutes the physical quantity sensor 1 is preferably doped with impurities such as phosphorus and boron. Accordingly, the conductivity of the first sensor element 98 (sensing portion 2) of the physical quantity sensor 1 and a shielding property as the shield electrode of the outer edge portion 90 may be improved.

The material of the physical quantity sensor 1 is not limited to silicon, and may be any material as long as the physical quantity on the basis of the change in electrostatic capacity can be detected.

As described above, according to the physical quantity sensor 1 of the first embodiment, the following effects may be obtained.

The physical quantity sensor 1 includes the outer edge portion 90 arranged on an outer periphery of the first sensor element 98 (outer periphery in a plan view of the physical quantity sensor 1) as the first functional element. The outer edge portion 90 includes the first grooves 92 extending in the first direction and arranged in parallel. In this configuration, the outer edge portion 90 may be configured as a shield electrode having an effect of blocking or reducing a leakage of a signal that the first sensor element 98 detects or a noise exerted to the first sensor element 98 from the outside for example. When configuring the outer edge portion 90 as the shield electrode, surrounding the outer periphery of the first sensor element 98 over a wider area is further effective. As in this Application Example, with the provision of the first grooves 92 in the outer edge portion 90, transmission of leaked vibrations and a leaked force from disturbance or the like transmitted from the outer edge portion 90 to the first sensor element 98 is alleviated by the first grooves 92. Therefore, the outer periphery of the first sensor element 98 may be surrounded over a wide area. Accordingly, there is provided the physical quantity sensor 1 as an electronic device stable in electric property, in which variations in electric property due to leaked vibrations and a leaked force from disturbance or the like transmitted from the outside to the first sensor element 98 are restrained while having the shielding effect that blocks or reduces a leakage of a signal detected by the first sensor element 98 or a noise exerted to the first sensor element 98 from the outside.

With the first sensor element 98, the outer edge portion 90, and the first grooves 92 in the outer edge portion 90 formed of the same material, these members may be formed integrally by, for example, patterning on a single silicon substrate when manufacturing, so that the physical quantity sensor 1 can be manufactured easily.

Modification of First Embodiment

Figure 2:
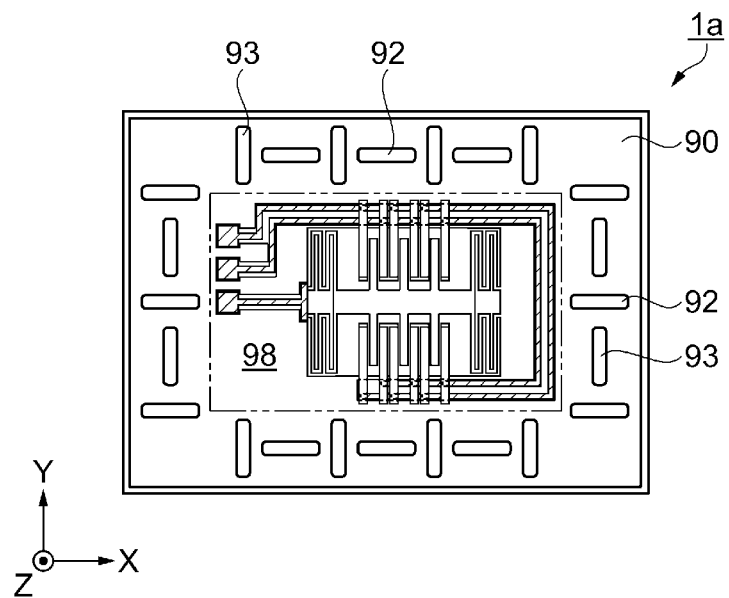
FIG. 2 is a schematic drawing illustrating a modification of the physical quantity sensor of the electronic device according to the first embodiment.

Here, a modification of the physical quantity sensor 1 according to the first embodiment will be described with reference to FIG. 2. FIG. 2 is a schematic drawing illustrating a modification of the physical quantity sensor 1 according to the first embodiment. A physical quantity sensor 1a of the modification illustrated in FIG. 2 is different from the configuration of the physical quantity sensor 1 of the first embodiment in the groove portions formed in the outer edge portion 90 (the first grooves 92 in the physical quantity sensor 1). In the following description about the physical quantity sensor 1a in the modification, only different points from the physical quantity sensor 1 are mainly described, and the same configuration may be denoted by the same reference signs and the repeated description may be omitted.

A physical quantity sensor 1a illustrated in FIG. 2 includes a first sensor element (first functional element) 98 as a sensor portion, and an outer edge portion 90 in the same manner as the physical quantity sensor 1 described above. Since the first sensor element 98 is the same as the physical quantity sensor 1 described above, description will be omitted because it is the same as the physical quantity sensor 1 described above.

The outer edge portion 90 arranged in the outer peripheral area of the first sensor element 98 includes a plurality of the first grooves 92 extending in the X-axis direction as the first direction and a plurality of second grooves 93 extending in the Y-axis direction as the second direction which intersects the first direction (X-axis direction) in plan view of the physical quantity sensor 1a. The first direction in which the first grooves 92 extend is a direction of displacement of the movable portion (that is, the movable electrode 50).

The first grooves 92 are hole grooves (elongated through holes) penetrating from an upper surface to a lower surface of the outer edge portion 90, and the length in the X-axis direction is approximately 70% of the frame width of the outer edge portion 90 having a frame shape, and the width in the Y-axis direction is approximately 10% of the frame width of the outer edge portion 90. The first grooves 92 are arranged about equidistantly in an area of a frame of the outer edge portion 90.

In the same manner as the first grooves 92, the second grooves 93 are hole grooves (elongated through holes) penetrating the outer edge portion 90, and the length in the Y-axis direction is approximately 70% of the frame width of the outer edge portion 90 having a frame shape, and the width in the X-axis direction is approximately 10% of the frame width of the outer edge portion 90. The second grooves 93 are arranged substantially equidistantly so as to be arranged between the first grooves 92 or alternately adjacently thereto.

The first grooves 92 and the second grooves 93 are arranged so that the figures composed of the first grooves 92 and the second grooves 93 have double rotational symmetry in plan view of the physical quantity sensor 1a.

The size and the number of the first grooves 92 and the second grooves 93 are not limited to those described above. For example, more of the first grooves 92 and the second grooves 93 with reduced length and width may be arranged. It is also possible to continue the first grooves 92 and the second grooves 93 to form, for example, cross-patterns, T-shapes, or L-shapes. However, attention should be paid in the configuration of the grooves so that the effect as the shield electrode is not impaired. The figures formed by the first grooves 92 and the second grooves 93 are preferably arranged so as to have rotational symmetry.

According to the physical quantity sensor 1a of the first modification, the physical quantity sensor includes the second grooves 93 extending in the second direction which intersects the first direction in addition to the first grooves 92 extending in the first direction in the outer edge portion 90 of the first sensor element 98. The leaked vibrations and a leaked force from disturbance or the like transmitted from the outer edge portion 90 to the first sensor element 98 is decomposed into a vector component in either the first direction or the second direction which intersects the first direction. With the provision of the first grooves 92 and the second grooves 93 as this application example, transmission of a stress applying on the groove in a direction which intersects the direction of extension of the grove is alleviated by the groove. Therefore, there is provided the physical quantity sensor 1a stable in electric property, in which variations in electric property due to leaked vibrations and a leaked force from disturbance or the like transmitted from the outside to the first sensor element 98 are restrained while having the shielding effect that blocks or reduces a leakage of a signal detected by the first sensor element 98 or a noise exerted to the first sensor element 98 from the outside.

Second Embodiment

Figure 3A:
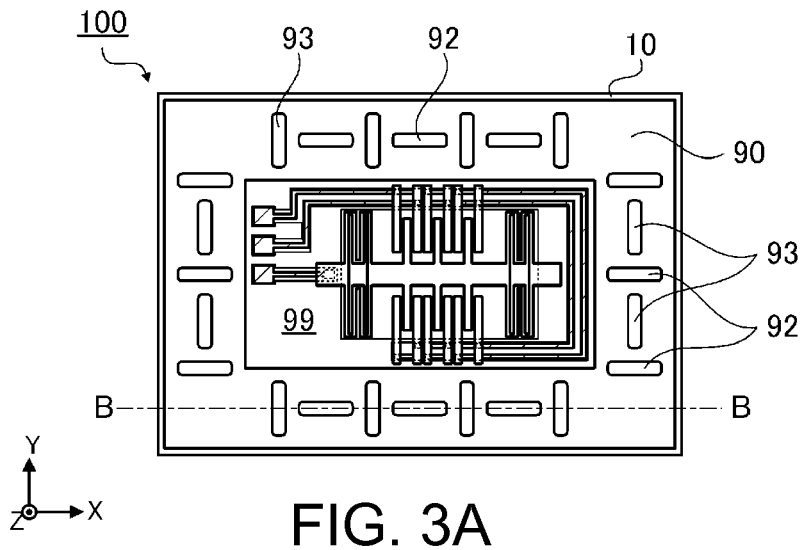
FIGS. 3A to 3C are schematic drawings illustrating a physical quantity sensor of the electronic device according to the second embodiment.
Figure 3B:
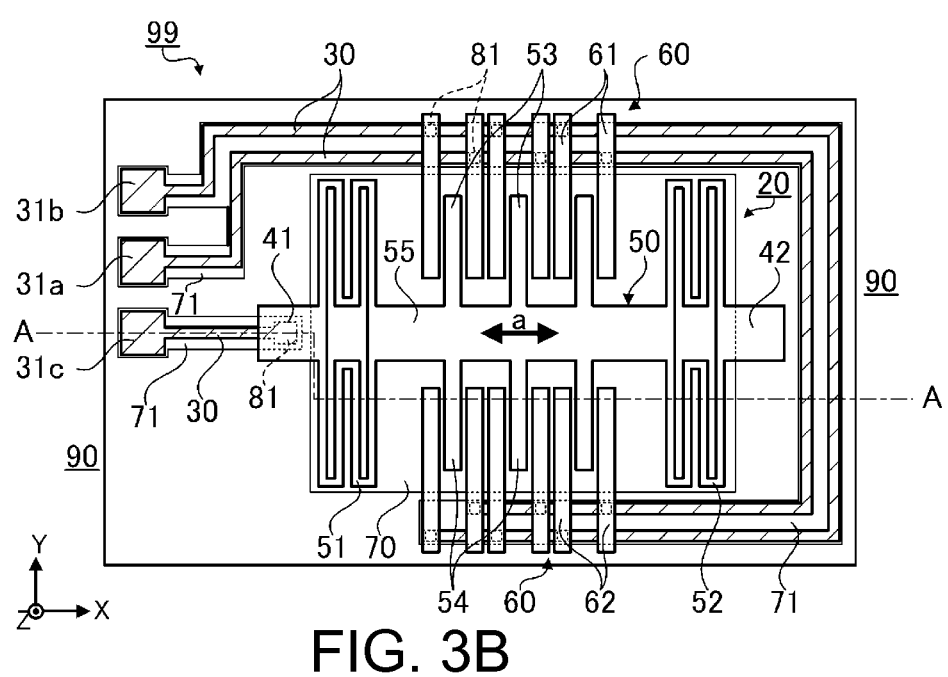
Figure 3C:
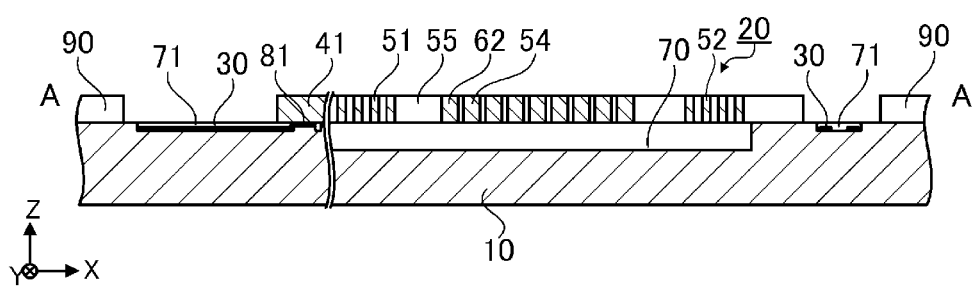

First of all, a physical quantity sensor of an electronic device according to a second embodiment will be described. FIGS. 3A to 3C are schematic drawings illustrating a physical quantity sensor of the electronic device according to the second embodiment. FIG. 3A is a plan view, FIG. 3B is a plan view of the sensor element of the physical quantity sensor, and FIG. 3C is a cross-sectional view taken along the line A-A in FIG. 3B. In the following example, description will be given with an X-direction as a rightward direction, an X-axis direction (±X direction) as a lateral direction, a Y-direction as a depth direction, a Y-axis direction (±Y direction) as a fore-and-aft direction, a Z-direction corresponds to an upward direction, and Z-axis direction (±Z direction) as a vertical direction or the thickness direction of the substrate 10 described later in XYZ axes shown in the drawings for the sake of convenience of explanation.

Configuration of Physical Quantity Sensor

A physical quantity sensor 100 includes a substrate 10, a first sensor element (first functional element) 99 as a sensor portion, and an outer edge portion 90. The substrate 10 is a plate-shaped member configured to support the physical quantity sensor 100 as a base substrate, and has a rectangular shape in plan view. The first sensor element 99 is provided on the main surface of the substrate 10. The substrate 10 also serves as a base substrate of the first sensor element 99. The first sensor element 99 includes a sensing portion 20 and wiring 30. The sensing portion 20 includes fixed portions 41 and 42, and the movable electrodes 50 as movable portions and the fixed electrode 60. The movable electrode 50 includes supporting portions 51 and 52, movable electrode fingers 53 and 54, and a movable base portion 55. The first sensor element (first functional element) 99 which constitutes the sensor portion and the outer edge portion 90 may be formed separately, but are preferably formed of the same material. The configuration in which the first sensor element (first functional element) 99 and the outer edge portion 90 are formed of the same material allows easy formation of the sensor portion in comparison with a configuration in which the first sensor element (first functional element) 99 and the outer edge portion 90 are formed separately.

The substrate 10 is provided with a depressed portion 70 on an upper surface as a main surface. The depressed portion 70 is formed in an area where the movable electrode 50 of the sensing portion 20 (the supporting portions 51 and 52, the movable electrode fingers 53 and 54, and the movable base portion 55) is accommodated in plan view of the substrate 10.

The fixed portions 41 and 42 are provided by being joined to the main surface of the substrate 10 in an area outside the area of the depressed portion 70 in plan view of the substrate 10. Specifically, a fixed portion 41 is joined to a portion of the depressed portion 70 on the main surface of the substrate 10 on the −X side (left side in the drawing), and a fixed portion 42 is joined to a portion of the depressed portion 70 on the +X-side (right side in the drawing). The fixed portions 41 and 42 are provided so as to straddle an outer peripheral edge portion of the depressed portion 70 in plan view, respectively.

The movable base portion 55 is a rectangular plate-shaped member oriented so that a longitudinal direction thereof extends in the X-direction, and is supported between the fixed portions 41 and 42 by the supporting portions 51 and 52 so as to be separated from the substrate 10. More specifically, a left end portion of the movable base portion 55 is coupled to the fixed portion 41 via a supporting portion 51, and a right end portion of the movable base portion 55 is coupled to the fixed portion 42 via a supporting portion 52.

A plurality of (three in this embodiment) beam-shaped movable electrode fingers 53 extend in a +Y direction from a long side portion of the movable base portion 55 on the +Y side, and a plurality of (three in this embodiment) beam-shaped movable electrode fingers 54 extend in −Y direction from a long side portion of the movable base portion 55 on a −Y side.

The depressed portion 70 is formed as a recessed portion for making the movable electrode 50 (the supporting portions 51 and 52, the movable electrode fingers 53 and 54, and the movable base portion 55) separate from the substrate 10. In this embodiment, the depressed portion 70 has a rectangular shape in plan view, but the shape of the depressed portion 70 is not limited thereto.

The supporting portions 51 and 52 couples the movable base portion 55 so as to be displaceable with respect to the fixed portions 41 and 42. In this embodiment, the supporting portions 51 and 52 are configured so as to be capable of displacing the movable base portion 55 in the X-axis direction as illustrated by an arrow a in FIG. 3B.

A plurality of movable electrode fingers 53 and a plurality of movable electrode fingers 54 extending in the Y-axis direction are arranged in line in the X-axis direction respectively in which the movable electrode 50 is displaced.

The supporting portion 51 includes two (a pair of) beams which have a shape extending in the +X direction while meandering in the Y-axis direction, respectively. In other words, the respective beams have a shape turned over a plurality of times (three times in this embodiment) in the Y-axis direction. The number of times of turning over of each beam may be one, two, four or more.

In the same manner, the supporting portion 52 includes a pair of beams having a shape extending in the −X direction while meandering in the Y-axis direction, respectively.

The fixed electrode 60 includes a plurality of fixed electrode fingers 61 and 62 arranged so as to form combs meshing with a plurality of movable electrode fingers 53 and 54 of the movable electrode 50 at a distance.

A pair each of fixed electrode fingers 61 are arranged on both sides in the X-axis direction so as to interpose one movable electrode finger 53 therebetween at a distance. In other words, a pair of the fixed electrode fingers 61, that is, two fixed electrode fingers 61 are arranged at three positions. In the same manner, a pair each of fixed electrode fingers 62 are arranged on both sides in the X-axis direction so as to interpose one movable electrode finger 54 therebetween at a distance. In other words, a pair of the fixed electrode fingers 62, that is, two fixed electrode fingers 62 are arranged at three positions.

The fixed electrode fingers 61 and 62 are provided with the one end portion thereof being joined to the main surface of the substrate 10 in an area outside the area of the depressed portion 70 on the main surface of the substrate 10 in plan view. Specifically, the fixed electrode fingers 61 are joined at ends thereof to upper surface of the substrate 10 on the +Y side of the depressed portion 70 on the side opposite to the movable electrode 50 (+Y side with respect to the movable electrode 50). The fixed electrode fingers 61 each have a fixed end on the fixed side, and a free end extending in the −Y direction. In the same manner, the fixed electrode fingers 62 are joined to upper surface of the substrate 10 at ends thereof on the −Y side of the depressed portion 70 on the side opposite to the movable electrode 50 (−Y side with respect to the movable electrode 50), and each have a fixed end on the fixed side, and a free end extending in the +Y direction.

In this configuration, an electrostatic capacity between the fixed electrode finger 61 positioned on the +X side of the movable electrode fingers 53 among the fixed electrode fingers 61 (hereinafter, referred to as first fixed electrode fingers) and the movable electrode fingers 53, and an electrostatic capacity between the fixed electrode fingers 61 positioned on the −X side of the movable electrode fingers 53 among the fixed electrode fingers 61 (hereinafter referred to as second fixed electrode fingers) and the movable electrode fingers 53 may be changed depending on the displacement of the movable electrode 50.

In the same manner, an electrostatic capacity between the fixed electrode finger 62 positioned on the +X side of the movable electrode fingers 54 among the fixed electrode fingers 62 (hereinafter, referred to as first fixed electrode fingers in the same manner) and the movable electrode fingers 54, and an electrostatic capacity between the fixed electrode fingers 62 positioned on the −X side of the movable electrode fingers 54 among the fixed electrode fingers 62 (hereinafter referred to as second fixed electrode fingers in the same manner) and the movable electrode fingers 54 may be changed depending on the displacement of the movable electrode 50.

The first fixed electrode finger and the second fixed electrode fingers are separated from each other on the substrate 10 and electrically insulated. Therefore, the electrostatic capacity between the first fixed electrode fingers and the movable electrode 50 (the movable electrode fingers 53 and 54), and the electrostatic capacity between the second fixed electrode fingers and the movable electrode 50 (movable electrode fingers 53 and 54) are measured separately, whereby the physical quantity can be detected precisely on the basis of the measurement result.

In other words, in the sensing portion 20, for example, the movable electrode 50 (the movable electrode fingers 53 and 54) is displaced in the X-axis direction (+X direction or −X direction) while deforming the supporting portions 51 and 52 resiliently in accordance with the change of the physical quantity such as an acceleration or an angular speed. The first sensor element 99 is capable of detecting the physical quantity such as the acceleration or the angular speed on the basis of the electrostatic capacity changed in association with such a displacement. In other words, the first sensor element 99 is a capacity type acceleration sensor.

The shapes of the movable electrode 50 and the fixed electrode 60 are determined by the shapes or the sizes of the respective portions constituting the sensing portion 20, and are not limited to the configuration described above.

The wiring 30 is an electric connection wiring for detecting the electrostatic capacity described above, and is laid along a concave portion 71 formed on the main surface of the substrate 10. The wiring 30 includes wiring for connecting the first fixed electrode fingers and then connecting an electrode 31a that is to be connected to an external circuit, wiring for connecting the second fixed electrode fingers and then connecting an electrode 31b to be connected to the external circuit, and wiring to be connected to an electrode 31c for connecting the movable electrode 50 to the external circuit.

The concave portion 71 is provided as an area in which the wiring 30 is laid in an area on the outside of the depressed portion 70. In other words, the concave portion 71 is formed so that the area where the wiring 30 is laid is included in an area of the concave portion 71 in plan view of the substrate 10.

The depth of the concave portion 71 (the dimension in the thickness direction of the substrate 10) is larger than the thickness of the wiring 30 and smaller than the depth of the depressed portion 70 except for a contact portion described later.

As described above, with a configuration in which the concave portion 71 is formed on the main surface of the substrate 10, and the wiring 30 having a thickness smaller than the depth of the concave portion 71 is laid in the area of the concave portion 71, contact between the wiring 30 and the sensing portion 20 laminated on an upper layer of the substrate 10 in the area other than a predetermined electrically contact portion is avoided.

The predetermined electrically connecting portion is a contact portion formed on the upper layer, which constitutes the sensing portion 20, so as to cover part of the wiring 30 and coming into contact with and electrically connected to the wiring 30.

As illustrated in FIG. 3B, connection between the first and the second fixed electrode fingers by the wiring 30 and the connection between the wiring 30 and the fixed portion 41 are achieved by a contact portion 81. The movable electrode 50 is electrically connected to the wiring 30 via the fixed portion 41. The material of the wiring 30 is the same as that described in the first embodiment, and hence description will be omitted.

An insulating film may be provided on the wiring 30 except for the contact portion where the wiring 30 and the upper layer which constitutes sensing portion 20 abut. The insulating film has a function to avoid an electric connection (short circuit) between the wiring 30 and a non-connecting portion of the sensing portion 20. The material of the insulating film is not specifically limited, and various materials having an insulating property may be employed. However, when the substrate 10 is formed of a glass material (especially a glass material added with alkali metal ion), silica dioxide ($SiO_2$) is preferably used.

The outer edge portion 90 has a function as a shield electrode having an effect of blocking or reducing a leakage of a signal that the first sensor element 99 detects or a noise exerted to the first sensor element 99 from the outside. The outer edge portion 90 is arranged on an outer peripheral area of the first sensor element 99 on the main surface of the substrate 10 in plan view of the substrate 10 as illustrated in FIG. 3A.

Specifically, the first sensor element 99 occupies a rectangular area in plan view at a center portion of the main surface of the substrate 10. The outer edge portion 90 is formed into a frame shape so as to completely surround the first sensor element 99 at the center portion of the main surface of the substrate 10. The outer edge portion 90 is provided with a fixed potential such as a ground potential by wiring (not shown) or the like, for example. In this manner, by configuring the outer edge portion 90 as the fixed potential such as the ground potential, the outer edge portion 90 has an effect as the shield electrode.

The outer edge portion 90 includes a plurality of the first grooves 92 extending in the X-axis direction as the first direction and a plurality of second grooves 93 extending in the Y-axis direction as the second direction which intersects the first direction (X-axis direction) in plan view of the substrate 10. In other words, the first direction in which the first grooves 92 extend is a direction of displacement of the movable portion (that is, the movable electrode 50).

The first grooves 92 are hole grooves (elongated through holes) penetrating from an upper surface to a lower surface of the outer edge portion 90, and the length in the X-axis direction is approximately 70% of the frame width of the outer edge portion 90 having a frame shape, and the width in the Y-axis direction is approximately 10% of the frame width of the outer edge portion 90. The first grooves 92 are arranged about equidistantly in an area of a frame of the outer edge portion 90.

In the same manner as the first grooves 92, the second grooves 93 are hole grooves (elongated through holes) penetrating the outer edge portion 90, and the length in the Y-axis direction is approximately 70% of the frame width of the outer edge portion 90 having a frame shape, and the width in the X-axis direction is approximately 10% of the frame width of the outer edge portion 90. The second grooves 93 are arranged substantially equidistantly so as to be arranged between the first grooves 92 or alternately adjacently thereto.

The first grooves 92 and the second grooves 93 are arranged so that the figure formed thereby has double rotational symmetry in plan view of the substrate 10.

The size and the number of the first grooves 92 and the second grooves 93 are not limited to those described above. For example, more of the grooves with reduced length and width may be arranged. It is also possible to continue the first grooves 92 and the second grooves 93 to form, for example, cross-patterns, T-shapes, or L-shapes. However, attention should be paid in the configuration of the grooves so that the effect as the shield electrode is not impaired. The figure formed by the first grooves 92 and the second grooves 93 are preferably arranged so as to have rotational symmetry.

In the second embodiment, the configuration in which the first grooves 92 and the second grooves 93 are provided has been described. However, a configuration in which the first grooves 92 are arranged in parallel as in the first embodiment is also applicable.

The sensing portion 20 (the fixed portions 41 and 42, the supporting portions 51 and 52, the movable electrode fingers 53 and 54, the movable base portion 55, and the fixed electrode fingers 61 and 62) and the outer edge portion 90 are preferably formed of silicon. When manufacturing, these members are preferably formed integrally from a single silicon substrate by patterning, for example.

The silicon substrate may be processed further precisely by etching. Therefore, superior dimensional accuracy of the sensing portion 20 or the like is achieved only by forming the sensing portion 20 mainly of the silicon substrate, and consequently, improved sensitivity of the first sensor element 99 is achieved.

The silicon material which constitutes the sensing portion 20 and the outer edge portion 90 is preferably doped with impurities such as phosphorus and boron. Accordingly, conductivity of the sensing portion 20 of the first sensor element 99 and a shielding property as the shield electrode of the outer edge portion 90 may be improved.

The material of the sensing portion 20 is not limited to silicon, and may be any material as long as the physical quantity on the basis of the change in electrostatic capacity can be detected.

A glass material having insulating property is used as the material for forming the substrate 10 as a preferable example. In particular, when the sensing portion 20 is formed of the silicon substrate, the glass material (for example, borosilicate glass such as Pyrex (registered trademark) glass) containing alkali metal ion (movable ion) is preferably used. Accordingly, the first sensor element 99 may be formed by anodically bonding the substrate 10 (glass substrate) and the sensing portion 20 (silicon substrate).

Figure 4A:
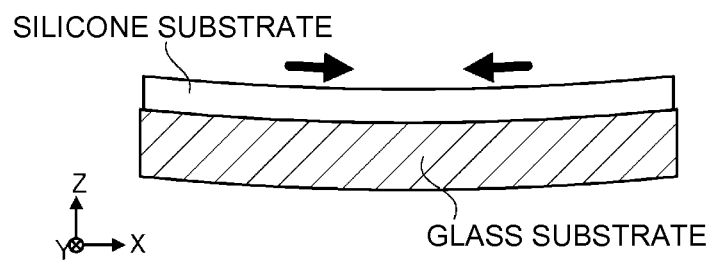
FIG. 4A is a schematic drawing illustrating a state in which a substrate and a silicon substrate are bonded to each other in the physical quantity sensor according to the second embodiment.

FIG. 4A is a schematic drawing illustrating a state where the glass substrate and the silicon substrate which constitute the outer edge portion and the sensing portion are bonded to each other.

As described above, in the physical quantity sensor having a laminated structure formed by bonding a layer (silicon substrate or the like) which constitutes the sensing portion and the outer edge portion (shield electrode) on the substrate (glass substrate or the like), there is a problem that the detection property as the sensor varies depending on the temperature of the environment of usage. Specifically, as illustrated in FIG. 4A, a thermal stress caused by the difference in the coefficient of thermal expansion between the glass substrate and the silicon substrate laminated on the glass substrate causes the glass substrate to warp may cause deformation of the sensor element by warping the glass substrate, or may affect the displacement of the movable portion (movable electrode) of the sensor element, whereby the detection property may vary.

In contrast, as in the second embodiment, the thermal stress may be alleviated by providing the first grooves 92 and the second grooves 93 in the outer edge portion 90 (silicon substrate).

Figure 4B:
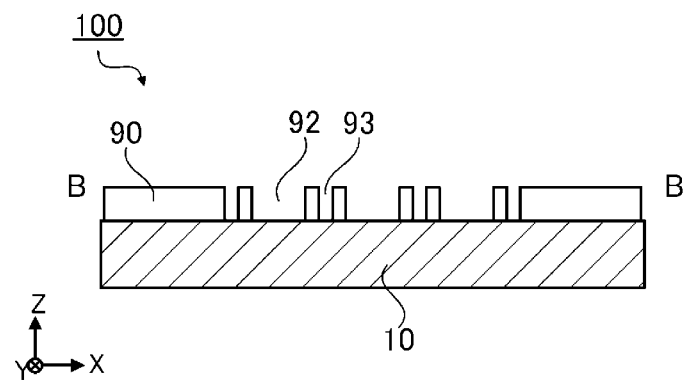
FIG. 4B is a cross-sectional view taken along the line B-B in FIG. 3A.

FIG. 4B is a cross-sectional view taken along the line B-B in FIG. 3A, and illustrates a state in which the first grooves 92 and the second grooves 93 are provided in the outer edge portion 90. As illustrated in this drawing, by forming the first grooves 92 and the second grooves 93 so as to penetrate through the outer edge portion 90, the thermal stress itself generated therein can be alleviated and transmission of the generated thermal stress can be restrained. In other words, the generated thermal stress is alleviated (reduced) by reducing the joint area between the substrate 10 and the outer edge portion 90, and transmission of the thermal stress can be decoupled by forming the outer edge portion 90 to be discontinuous. Consequently, generation of a warp as illustrated in FIG. 4A is restrained.

Method of Manufacturing Physical Quantity Sensor

A method of manufacturing a physical quantity sensor 100 of an electronic device according to a second embodiment will now be described. FIGS. 5A to 5D are cross-sectional front views schematically illustrating a method of manufacturing the physical quantity sensor 100 of the electronic device according to the second embodiment.

As illustrated in FIG. 5A, the depressed portion 70 and the concave portion 71 are formed on the surface of the substrate 10. The material of the substrate 10 is an insulating material such as glass, for example. The formation of the depressed portion 70 and the concave portion 71 is performed by using Photolithography and, is formed by etching by using a chrome (Cr) layer and a gold (Au) layer, which are not illustrated, as mask patterns. Accordingly, the depressed portion 70 and the concave portion 71 are formed by etching from the upper surface. Etching is performed by, for example, wet etching using solution containing fluorine, or dry etching using plasma.

A conductive material which constitutes the wiring 30 and the contact portion 81 is formed and patterned on a bottom surface of the concave portion 71. The material of the conductive material is not specifically limited and metallic materials such as gold (Au), gold alloy, platinum (Pt), aluminum (Al), aluminum alloy, silver (Ag), silver alloy, chrome (Cr), chrome alloy, copper (Cu), molybdenum (Mo), niobium (Nb), tungsten (W), iron (Fe), titanium (Ti), cobalt (Co), zinc (Zn), and zirconium (Zr), or electrode materials such as ITO, ZnO may be used for example.

Subsequently, as illustrated in FIG. 5B, a functional element substrate 40 which constitutes the sensor portion is bonded to the substrate 10. The functional element substrate 40 is a silicon substrate, and bonding with the substrate 10 is performed by, for example, anodic bonding. The functional element substrate 40 is bonded to a flat-surface portion of the substrate 10 except for the depressed portion 70 and the concave portion 71.

Subsequently, as illustrated in FIG. 5C, etching using Photolithography is performed on the functional element substrate 40 to form the sensor portion. Dry etching or wet etching is employed as etching. A resist layer 48 is patterned at a predetermined position, and a portion of the exposed functional element substrate 40 is etched, whereby the fixed portion 41, the supporting portion 51, and the movable electrode fingers 54 among the fixed electrode finger 62, the movable base portion 55, and the outer edge portion 90 are formed. At this time, the first grooves 92 penetrating through the outer edge portion 90 and extending in the first direction (X-axis direction) and the second groove 93 extending in the second direction (Y-axis direction) which intersects the first direction in the outer edge portion 90 are formed.

With the process as described thus far, the physical quantity sensor 100 including the substrate 10, the first sensor element (first functional element) 99 as the sensor portion formed of the functional element substrate 40 bonded to the substrate 10, and the sensor portion including the outer edge portion 90 may be formed as illustrated in FIG. 5D.

According to the method of manufacturing the above-described physical quantity sensor 100, the functional element substrate 40 is joined to the substrate 10 so as to oppose the depressed portion 70, then patterning is performed on the functional element substrate 40 to form the first sensor element (first functional element) 99, the outer edge portion 90, and the first grooves 92 and the second grooves 93 in the outer edge portion 90. In this manner, the first sensor element (first functional element) 99, the outer edge portion 90, and the first grooves 92 and the second grooves 93 in the outer edge portion 90 may be formed from the functional element substrate 40 joined to the substrate 10 in the same process. In other words, the first sensor element (first functional element) 99, the outer edge portion 90, the first grooves 92 and the second grooves 93 in the outer edge portion 90 may be formed easily.

As described above, according to the physical quantity sensor 100 of the second embodiment, the following effects may be obtained.

The physical quantity sensor 100 includes the substrate 10, the first sensor element 99 provided on the main surface of the substrate 10, and the outer edge portion 90 arranged on an outer periphery of the first sensor element 99 (outer periphery in plan view of the substrate 10). The outer edge portion 90 includes the first grooves 92 extending in the first direction (X-axis direction), and the second grooves 93 extending in the second direction (Y-axis direction) which intersects the first direction. Therefore, the thermal stress generated in a case where the outer edge portion 90 has a coefficient of thermal expansion different from a coefficient of thermal expansion of the substrate 10 is alleviated by any one of these grooves.

Specifically, transmission of the stress acting in the direction which intersects the direction of extension of the groove is alleviated by the groove. Therefore, the thermal stress generated between the substrate 10 and the outer edge portion 90 on the main surface of the substrate 10 is alleviated by these grooves (the first grooves 92, the second grooves 93, or at least one of these grooves). For example, in a case where the substrate 10 is warped by the thermal stress, the warp is alleviated by these grooves. Consequently, deformation of the first sensor element 99 caused by thermal stress generated by a difference in coefficient of thermal expansion and an influence on the displacement of the movable portion (movable electrode 50) provided on the first sensor element 99 are restrained, so that variations in detection property caused by the temperature change in the environment of usage of the first sensor element 99 are restrained.

Since the outer edge portion 90 and the first grooves 92 and the second grooves 93 of the outer edge portion 90 can be formed by the same process, the first sensor element (first functional element) 99, the outer edge portion 90, the first grooves 92 and the second grooves 93 of the outer edge portion 90 can be formed easily.

In other words, the physical quantity sensor in which variations in detection property due to the temperature change in the environment of usage are restrained and which has a more stable detection property can be easily formed and provided.

The first direction is the direction of displacement of the movable portion provided on the first sensor element 99 (the direction of displacement in plan view of the substrate 10). In other words, the outer edge portion 90 arranged on the outer periphery of the first sensor element 99 includes the first grooves 92 extending in the same direction as the direction of displacement of the movable portion provided on the first sensor element 99 and the second grooves 93 extending in the direction which intersects the direction of displacement of the movable portion provided on the first functional element in plan view of the substrate 10.

When the outer edge portion 90 has a coefficient of thermal expansion different from the coefficient of thermal expansion of the substrate 10, the outer edge portion 90 includes the second grooves 93 extending in the direction which intersects the direction of displacement of the movable portion provided on the first sensor element 99. Therefore, the thermal stress generated in the direction of displacement of the movable portion by the second groove 93 can be alleviated further effectively. In particular, the thermal stress is alleviated more effectively since the second grooves 93 extend so as to intersect the direction of displacement of the movable portion at a substantially right angle.

With the provision of the first grooves 92 in the outer edge portion 90, thermal stress that the substrate 10 receives from the outer edge portion 90 is reduced. With the provision of the first grooves 92 extending in the direction of displacement of the movable portion provided on the first sensor element 99 in the outer edge portion 90, thermal stress generated in the direction of displacement of the movable portion that the substrate 10 receives from the outer edge portion 90 is restrained.

Consequently, deformation of the first sensor element 99 caused by the thermal stress generated by a difference in coefficient of thermal expansion and an influence on the displacement of the movable portion (movable electrode 50) provided on the first sensor element 99 are restrained, so that variations in detection property caused by the temperature change in the environment of usage of the first sensor element 99 are restrained.

Third to Fifth Embodiments

Subsequently, physical quantity sensors according to the third to the fifth embodiments will be described with reference to FIGS. 6A to 6C. In the description, portions having the same configurations as those described in the second embodiment are denoted by the same reference signs, and overlapped description will be omitted. In the third to the fifth embodiments given below, description may be given with an X-direction as a rightward direction, an X-axis direction (±X direction) as a lateral direction, a Y-direction as a depth direction, a Y-axis direction (±Y direction) as a fore-and-aft direction, a Z-direction corresponds to an upward direction, and Z-axis direction (±Z direction) as a vertical direction or the thickness direction of the substrate 10 described later in XYZ axes shown in FIGS. 6A to 6C for the sake of convenience of explanation.

Third Embodiment

First of all, a physical quantity sensor according to a third embodiment will be described. FIG. 6A is a schematic plan view illustrating a physical quantity sensor 101 according to the third embodiment.

Figure 6A:
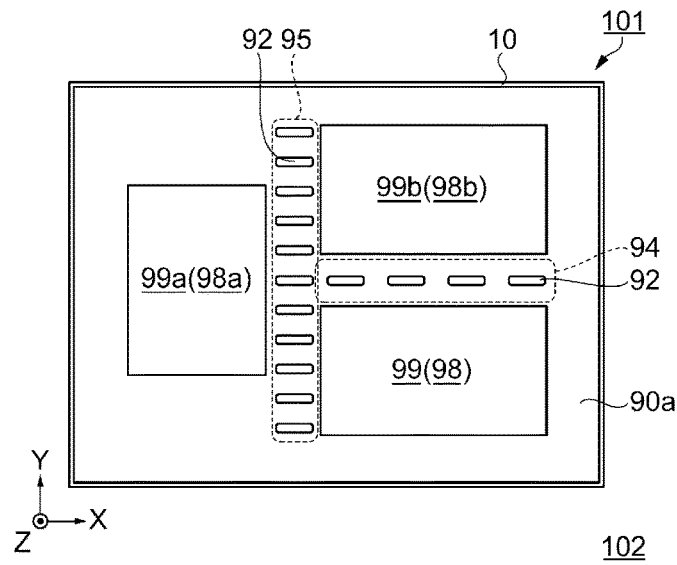
FIG. 6A is a schematic plan view illustrating a physical quantity sensor of an electronic device according to a third embodiment.

The physical quantity sensor 101 of the third embodiment illustrated in FIG. 6A includes, in addition to the first functional element (first sensor element 99), the second functional element (the second sensor element 99a, the third sensor element 99b) in the configuration of the sensor portion, and includes the first grooves 92 in the outer edge portion in an area between the respective sensor elements.

A physical quantity sensor 101 includes a substrate 10, the first sensor element 99, and the second sensor element 99a and the third sensor element 99b as the second functional element, and an outer edge portion 90a.

The second sensor element 99a is a capacity type acceleration sensor having, for example, the same configuration as the first sensor element 99, and being different in direction (orientation) of installation. The first sensor element 99 detects an acceleration in the X-axis direction, while the second sensor element 99a is arranged in the direction detecting the acceleration in the Y-axis direction.

The third sensor element 99b is a gyrosensor configured to detect an angular speed, for example. A vibrator is provided in the interior thereof as a movable portion.

The first sensor element 99, the second sensor element 99a, the third sensor element 99b are arranged at a distance on the main surface of the substrate 10 as illustrated in FIG. 6A. Specifically, the first sensor element 99 is arranged in a lower right area of the rectangular substrate 10 (an area in +X, −Y side), the third sensor element 99b is arranged in an area in the depth direction thereof (an area in +X, +Y side), and the second sensor element 99a is arranged on an left side area (an area at a center in the Y-axis direction on the −X side) of the first sensor element 99 and the third sensor element 99b.

The outer edge portion 90a is arranged around the outer periphery of the respective sensor elements. In other words, the outer edge portion 90a is formed in an area other than the areas on the main surface of the substrate 10 occupied by the respective sensor elements. The outer edge portion 90 is provided with a ground potential, for example, by wiring or the like.

The first grooves 92 are provided in the outer edge portion 90a in the area between the respective sensor elements. Specifically, a groove row 94 including the first grooves 92 arranged in the X-axis direction is provided in the outer edge portion 90a in the area between the first sensor element 99 and the third sensor element 99b. Also, a groove row 95 including the first grooves 92 arranged in the Y-axis direction is provided in the outer edge portion 90a in the area between the first sensor element 99 and the second sensor element 99a, and between the third sensor element 99b and the second sensor element 99a.

It is not necessarily required to provide both of the groove row 94 and the groove row 95 as long as the groove row is provided in the area which requires alleviation of the stress generated between the sensor elements.

As described above, according to the physical quantity sensor 101 of the first embodiment, the following effects may be obtained.

A physical quantity sensor 101 includes, in addition to the first functional element (the first sensor element 99) provided on the main surface of the substrate 10, the second functional element (the second sensor element 99a and the third sensor element 99b). In this manner, in the case where a plurality of the sensor elements are provided on the common substrate, the detection property as the physical quantity sensor may be deteriorated by an influence of the noise generated by one of the sensor elements exerted on the other sensor element, for example. The noise may be caused not only by electrical factors, but also by mechanical energy such as a stress or vibrations. Specifically, due to the thermal stress or the residual stress generated by or present in a sensor element structure or, if the movable portion is provided, the vibration leakage from the movable portion may be transmitted to the adjacent sensor element and affect the detection property of the sensor element.

According to the third embodiment, the first grooves 92 are provided in the outer edge portion 90a in either one of the area at least between the first sensor element 99 and the second sensor element 99a, between the first sensor element 99 and the third sensor element 99b, and between the second sensor element 99a and the third sensor element 99b. Therefore, transmission of energy such as a stress applied between the sensor elements or leaked vibrations transmitted from one to the other is alleviated by the first grooves 92, so that the influence on the property is reduced.

Fourth Embodiment

Subsequently, a physical quantity sensor according to a fourth embodiment will be described with reference to FIG. 6B. FIG. 6B is a schematic plan view illustrating a physical quantity sensor 102 according to the fourth embodiment.

Figure 6B:
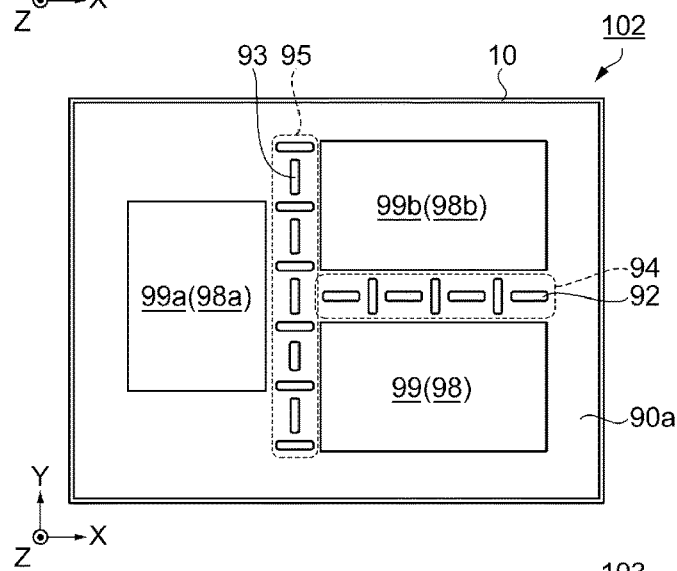
FIG. 6B is a schematic plan view illustrating a physical quantity sensor of an electronic device according to a fourth embodiment.

In the same manner as the third embodiment, the physical quantity sensor 102 of the fourth embodiment illustrated in FIG. 6B includes, in addition to the first functional element (first sensor element 99), the second functional element (the second sensor element 99a, the third sensor element 99b), and includes the first grooves 92 and the second grooves 93 in the outer edge portion 90a between the respective sensor elements.

The configuration and the arrangement of the first functional element (first sensor element 99) and the second functional element (the second sensor element 99a, the third sensor element 99b) are the same as those in the third embodiment, and the description will be omitted.

The outer edge portion 90a is arranged around the outer periphery of the respective sensor elements. In other words, the outer edge portion 90a is formed in an area other than the areas on the main surface of the substrate 10 occupied by the respective sensor elements. The outer edge portion 90 is provided with a ground potential, for example, by wiring or the like.

The first grooves 92 and the second grooves 93 are provided in the outer edge portion 90a in the area between the respective sensor elements. Specifically, the groove row 94 composed of a row including the first grooves 92 and the second grooves 93 arranged in the X-axis direction alternately is provided in the outer edge portion 90a in the area between the first sensor element 99 and the third sensor element 99b. Also, the groove row 95 composed of a row including the first grooves 92 and the second grooves 93 arranged alternately in the Y-axis direction in the outer edge portion 90a in the area between the first sensor element 99 and the second sensor element 99a, and between the third sensor element 99b and the second sensor element 99a.

In the groove row 94 and the groove row 95, the figure formed of the first grooves 92 and the second grooves 93 has double rotational symmetry in plan view of the substrate 10.

It is not necessarily required to provide both of the groove row 94 and the groove row 95 as long as the groove row is provided in the area which requires alleviation of the stress generated between the sensor elements.

As described above, according to the physical quantity sensor 102 of the first embodiment, the following effects may be obtained.

A physical quantity sensor 102 includes, in addition to the first functional element (the first sensor element 99) provided on the main surface of the substrate 10, the second functional element (the second sensor element 99a and the third sensor element 99b). In this manner, in the case where a plurality of the sensor elements are provided on the common substrate, the detection property as the physical quantity sensor may be deteriorated by an influence of the noise generated by one of the sensor elements exerted on the other sensor element, for example. The noise may be caused not only by electrical factors, but also by mechanical energy such as a stress or vibrations. Specifically, due to the thermal stress or the residual stress generated by or present in a sensor element structure and, if the movable portion is provided, the vibration leakage from the movable portion may be transmitted to the adjacent sensor element and affect the detection property of the sensor element.

According to the fourth embodiment, the first grooves 92 and the second grooves 93 are provided in the outer edge portion 90a in either one of the area at least between the first sensor element 99 and the second sensor element 99a, between the first sensor element 99 and the third sensor element 99b, and between the second sensor element 99a and the third sensor element 99b. Therefore, transmission of energy such as a stress applied between the sensor elements or leaked vibrations transmitted from one to the other is alleviated by at least one of the first grooves 92 and the second grooves 93, or at least one of them, and the influence on the property is reduced.

Fifth Embodiment

Subsequently, a physical quantity sensor according to a fifth embodiment will be described. FIG. 6C is a schematic plan view illustrating a physical quantity sensor 103 according to the fifth embodiment.

Figure 6C:
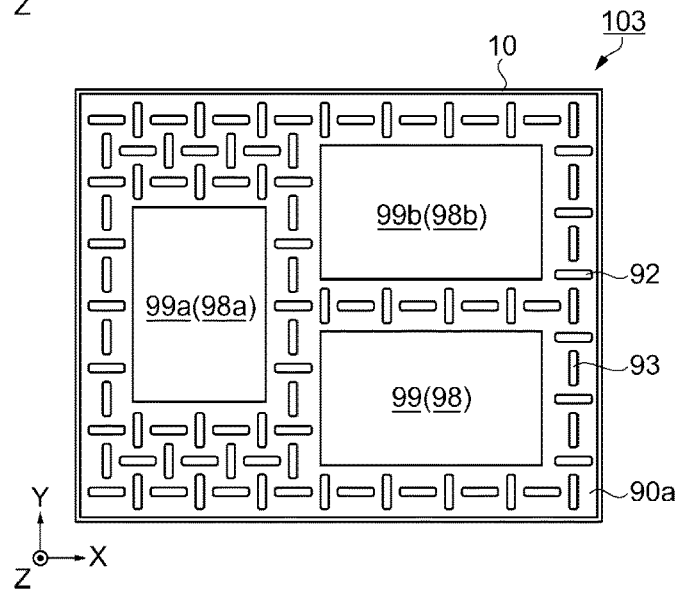
FIG. 6C is a schematic plan view illustrating a physical quantity sensor of an electronic device according to a fifth embodiment.

FIG. 6C is a schematic plan view illustrating a physical quantity sensor 103 according to the fifth embodiment. In the same manner as the fourth embodiment, the physical quantity sensor 103 of the fifth embodiment illustrated in FIG. 6C includes the first functional element and the second functional element, and also the first grooves 92 and the second grooves 93 over the entire area (entire surface) of the outer edge portion 90a surrounding the outer peripheries of the respective sensor elements.

The physical quantity sensor 103 is the same as the physical quantity sensor 102 except that the position or the number of the first grooves 92 and the second grooves 93 provided in the outer edge portion 90a are different. The physical quantity sensor 103 is arranged so that the first grooves 92 and the second grooves 93 are arranged alternately in the X-axis direction and the Y-axis direction over the entire area of the outer edge portion 90a as illustrated in FIG. 6C. The first grooves 92 and the second grooves 93 are arranged so that the figure formed thereby has double rotational symmetry in plan view of the substrate 10.

According to the physical quantity sensor 103 of the fifth embodiment, the following effects may be obtained.

The thermal stress generated in a case where the outer edge portion 90a has a coefficient of thermal expansion different from a coefficient of thermal expansion of the substrate 10 is alleviated by these grooves, (the first grooves 92 or the second grooves 93, or one of them). Also thermal stress generated between the substrate 10 and the outer edge portion 90a on the main surface of the substrate 10 is also alleviated by either one of these grooves. Consequently, deformation of the sensor elements (the first sensor element 99, the second sensor element 99a, and the third sensor element 99b) provided on the main surface of the substrate 10 or an influence on the displacement of the movable portion provided on the sensor elements by a thermal stress generated by the difference in coefficient of thermal expansion are restrained, so that variations in detection property caused by the temperature change in the environment of usage of the sensor elements are restrained.

Therefore, transmission of energy such as a stress applied between sensor elements or leaked vibrations transmitted from one to the other is alleviated by at least one of the first grooves 92 and the second grooves 93, or at least one of them, and the influence on the property is reduced.

In this manner, with the arrangement of the first grooves 92 and the second grooves 93 alternately in the X-axis direction and the Y-axis direction over the entire area of the outer edge portion 90a, stabilization of the detection property may be achieved further effectively.

In the third to the fifth embodiments described above, the configuration in which the first functional element (the first sensor element 99) described in the second embodiment, and in addition, the second functional element (the second sensor element 99a and the third sensor element 99b) are provided in the configuration of the sensor portion has been described. However, the invention is not limited thereto. The configuration of the sensor portion may be a configuration provided with the first functional element (the first sensor element 98) described in the first embodiment and, in addition, the second functional element (the second sensor element 98a and the third sensor element 98b) is also applicable. Specifically, a configuration in which the first sensor element 99 is replaced by the first sensor element 98, the second sensor element 99a is replaced by the second sensor element 98a, and the third sensor element 99b is replaced by the third sensor element 98b is also applicable.

In the first to the fifth embodiment, the second grooves 93 are arranged between the first grooves 92 arranged substantially equidistantly or arranged adjacent thereto substantially equidistantly in the description given above. However the first grooves 92 and the second grooves 93 do not have to be arranged alternately. The first grooves 92 and the second grooves 93 do not necessarily have to be arranged equidistantly. The layout of the first grooves 92 and the second grooves 93 is preferably determined depending on the shape or the size of the outer edge portion in which the first grooves 92 and the second grooves 93 are arranged or the arrangement or the orientation of the sensor elements, or the supposed effect of alleviation of the stress.

The sensor element is not necessarily limited to the sensor having the configuration described above. If the configuration of the physical quantity sensor is a structure in which layers constituting the sensor elements and the outer edge portion are laminated on the main surface of the substrate, and a thermal stress generated by the difference in coefficient of thermal expansion between the outer edge portion and the substrate, or the stress transmitted via the outer edge portion arranged between the sensor elements affects the detection property of the sensor elements, the same effects are achieved.

Sixth Embodiment

Figure 7:
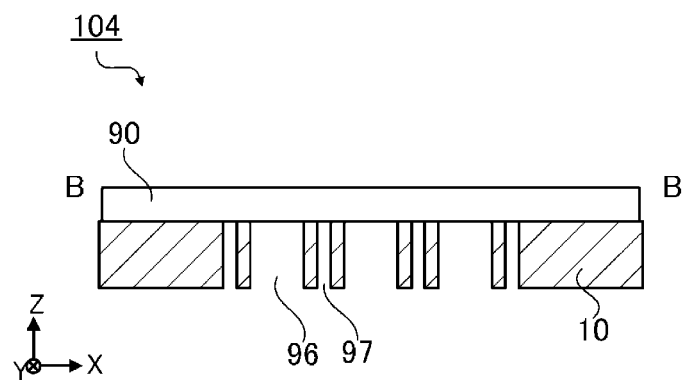
FIG. 7 is a cross-sectional view illustrating a physical quantity sensor of an electronic device according to a sixth embodiment.

FIG. 7 is a cross-sectional view illustrating a physical quantity sensor 104 according to the sixth embodiment, and is a cross-sectional view of a position corresponding to the cross section taken along the line B-B in FIG. 3A. In the second to the fifth embodiments, a configuration in which the first grooves 92 and the second grooves 93 for alleviating the stress are provided in the outer edge portion on the main surface of the substrate 10 has been described. However, these grooves may be provided on the substrate 10.

The physical quantity sensor 104 is not provided with the first grooves 92 and the second grooves 93 in the outer edge portion 90. Instead, third grooves 96 and fourth grooves 97 are provided on the substrate 10. Except for this point, the physical quantity sensor 104 is the same as the physical quantity sensor 100 of the second embodiment. The third grooves 96 correspond to the first grooves and the fourth grooves 97 correspond to the second grooves.

The third grooves 96 are hole grooves (elongated through holes) penetrating from the main surface to the lower surface of the substrate 10, and are arranged at the same position as the first grooves 92 in the physical quantity sensor 100 in plan view of the substrate 10. In the same manner, the fourth grooves 97 are hole grooves (elongated through holes) penetrating from the main surface to the lower surface of the substrate 10, and are arranged at the same position as the second grooves 93 in the physical quantity sensor 100 in plan view of the substrate 10. In other words, the third groove 96 and the fourth groove 97 are both provided in an area overlapped with the outer edge portion 90.

According to the physical quantity sensor 104 of the sixth embodiment, the substrate 10 includes the third groove 96 extending in the first direction and the fourth groove 97 extending in the second direction, which intersects the first direction in the area overlapped with the outer edge portion 90. Therefore, the thermal stress generated in a case where the substrate 10 includes a coefficient of thermal expansion different from the coefficient of thermal expansion of the outer edge portion 90 is alleviated by any one of these grooves. Consequently, deformation of the first sensor element 99 caused by the thermal stress generated by a difference in coefficient of thermal expansion and an influence on the displacement of the movable portion (movable electrode 50) provided on the first sensor element 99 are restrained, so that variations in detection property caused by the temperature change in the environment of usage of the first sensor element 99 are restrained.

In other words, even when the grooves for alleviating the stress are provided on the substrate 10 as in the sixth embodiment, the physical quantity sensor 104 stable in detection property in which variations in detection property due to the temperature change in the environment of usage are restrained is provided.

The invention is not limited to the above-described embodiment and various modification of improvement may be made. A modification will be described below. Here, portions having the same configurations as those described in the embodiments described above are denoted by the same reference signs, and overlapped description will be omitted.

Modifications of First Grooves and Second Grooves

Figure 8A:
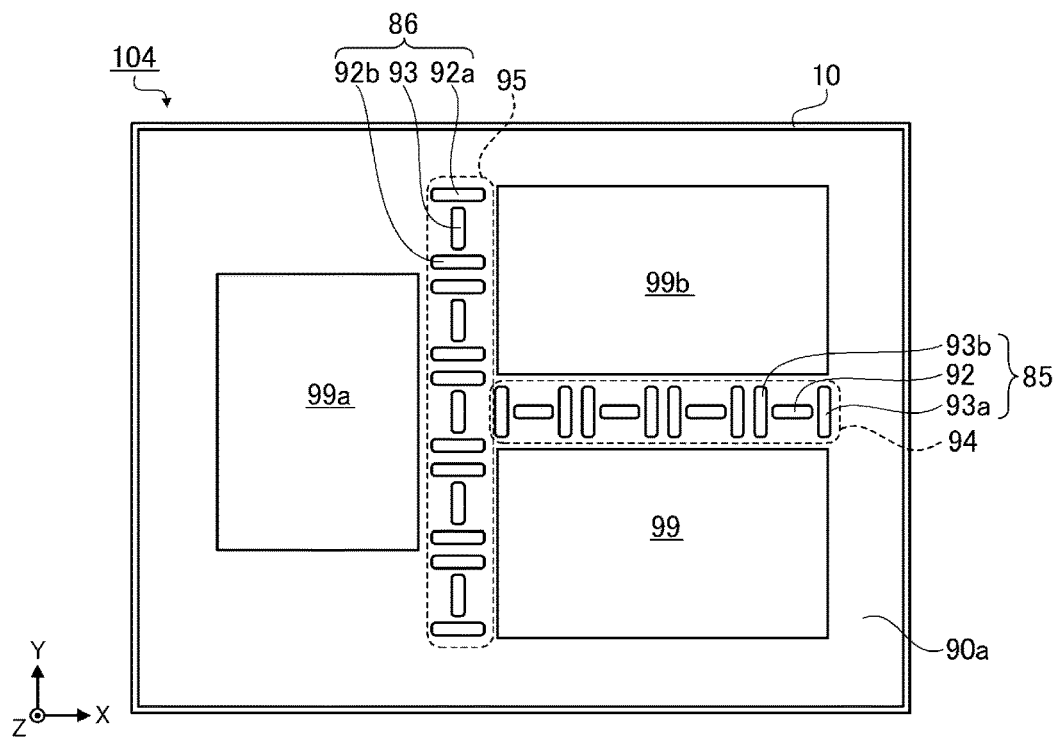
FIG. 8A is a plan view illustrating a first modification of a first groove and a second groove of an outer edge portion.

Subsequently, modifications of the first grooves and the second grooves will be described with reference to FIG. 8A and FIG. 8B. FIG. 8A is a plan view illustrating a first modification of a first groove and a second groove.

Figure 8B:
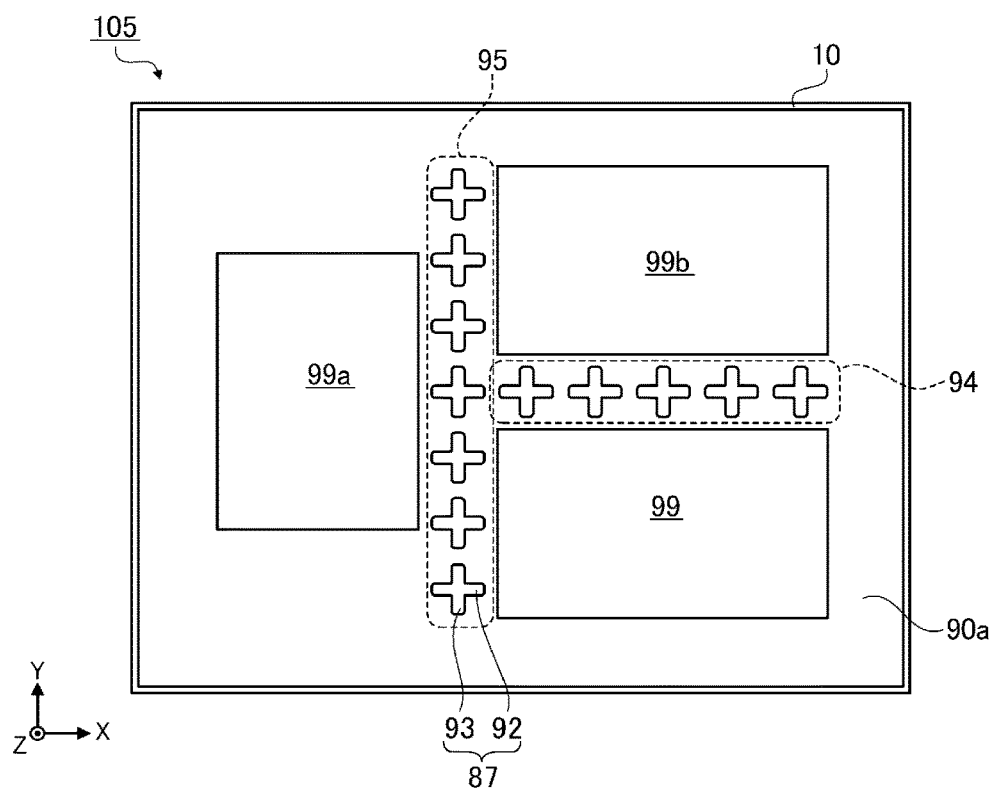
FIG. 8B is a plan view illustrating a second modification of the first groove and the second groove.

FIG. 8B is a plan view illustrating a second modification of the first groove and the second groove. In the description, portions having the same configurations as those described in the embodiments described above are denoted by the same reference signs, and overlapped description will be omitted. First modification and Second modification are different from the above-described second to the fifth embodiments in the arrangement of the first grooves 92 and the second grooves 93.

First Modification

In the first modification illustrated in FIG. 8A, the groove row 94 composed of a row including the first grooves 92 and the second grooves 93 arranged in the X-axis direction is provided in the outer edge portion 90a in the area between the first sensor element 99 and the third sensor element 99b in the same manner as the second to the fifth embodiments. Also, the groove row 95 composed of a row including the first grooves 92 and the second grooves 93 arranged alternately in the Y-axis direction is provided in the outer edge portion 90a in the area between the first sensor element 99 and the second sensor element 99a, and between the third sensor element 99b and the second sensor element 99a. The arrangement of the first grooves 92 and the second grooves 93 of the groove row 94 is such that a groove group 85 including the second grooves 93a and second grooves 93b with the first grooves 92 interposed therebetween is arranged in the X-axis direction. The arrangement of the first grooves 92 and the second grooves 93 of the groove row 95 is such that a groove group 86 including the first grooves 92a and first grooves 92b with the second grooves 93 interposed therebetween is arranged in the Y-axis direction.

Second Modification

In the second modification illustrated in FIG. 6B, the groove row 94 composed of a row including the first grooves 92 and the second grooves 93 arranged in the X-axis direction is provided in the outer edge portion 90a in the area between the first sensor element 99 and the third sensor element 99b in the same manner as the second to the fifth embodiments. Also, the groove row 95 composed of a row including the first grooves 92 and the second grooves 93 arranged alternately in the Y-axis direction is provided in the outer edge portion 90a in the area between the first sensor element 99 and the second sensor element 99a, and between the third sensor element 99b and the second sensor element 99a. In the groove row 94 and the groove row 95, groove groups 87 each having the first groove 92 and the second groove 93 so as to intersect each other at substantially a center in a so-called cross-shape are arranged. In the groove row 94 and the groove row 95 of the second modification, the groove groups 87 each having the cross shape are arranged in the X-axis direction and the Y-axis direction.

In the first grooves 92 and the second grooves 93 in the first modification and the second modification as well, the thermal stress generating in a case where the outer edge portion 90a has a coefficient of thermal expansion different from the coefficient of thermal expansion of the substrate 10 is alleviated by at least one of the first grooves 92 and the second grooves 93. Also, the first sensor element (first functional element) 99, the outer edge portion 90a, the first grooves 92 and the second grooves 93 of the outer edge portion 90a may be formed easily in the same process. In other words, the physical quantity sensor in which variations in detection property due to the temperature change in the environment of usage are restrained and which has a more stable detection property can be easily formed and provided.

In the first modification and the second modification described above, the configuration in which the first functional element (the first sensor element 99) described in the second embodiment, and in addition, the second functional element (the second sensor element 99a and the third sensor element 99b) are provided in the configuration of the sensor portion has been described. However, the invention is not limited thereto. The configuration of the sensor portion may be a configuration provided with the first functional element (the first sensor element 98) described in the first embodiment and, in addition, the second functional element (the second sensor element 98a and the third sensor element 98b) is also applicable in place of the functional element in the second embodiment. Specifically, a configuration in which the first sensor element 99 is replaced by the first sensor element 98, the second sensor element 99a is replaced by the second sensor element 98a, and the third sensor element 99b is replaced by the third sensor element 98b is also applicable.

In the first to the fourth embodiments described above, the configuration in which both of the groove row 94 and the groove row 95 are provided has been described. However, it is not necessarily required to provide both of the groove row 94 and the groove row 95 as long as the groove row is provided in the area which requires alleviation of the stress generated between the sensor elements.

The outer edge portion 90 does not have to surround the sensor element 99 over the entire circumference. In other words, part of the outer edge portion 90 may be opened as long as part of the effects of the invention is achieved.

In the first to the sixth embodiments, the first direction is described as being the X-axis direction, which is a direction of displacement of the movable portion (the movable electrode 50). However, the invention is not limited thereto. For example, a configuration in which the Y-axis direction is the first direction and the X-axis direction is the second direction is also applicable.

In the first to the sixth embodiments, the first grooves 92 and the second grooves 93 have been described as being the hole grooves (elongated through holes) penetrating from the upper surfaces of the outer edge portions 90 and 90a to the lower surface. However, these grooves do not necessarily have to be penetrated therethrough. In other words, one or both of the first grooves 92 and the second grooves 93 may be bottomed grooves, which do not penetrate through the outer edge portions 90 and 90a. The bottom portion may be on the lower surface side (the substrate 10 side) or, on the contrary, on the upper surface side.

Electronic Apparatus

Subsequently, electronic apparatuses to which the physical quantity sensor 100 is applied as the electronic device according to an embodiment of the invention will be described with reference to FIG. 9A, FIG. 9B, and FIG. 10. In the following explanation, an example in which the physical quantity sensor 100 is applied will be described. However, the physical quantity sensor may be one of the physical quantity sensors 1, 101, 102, 103, and 104.

Figure 9A:
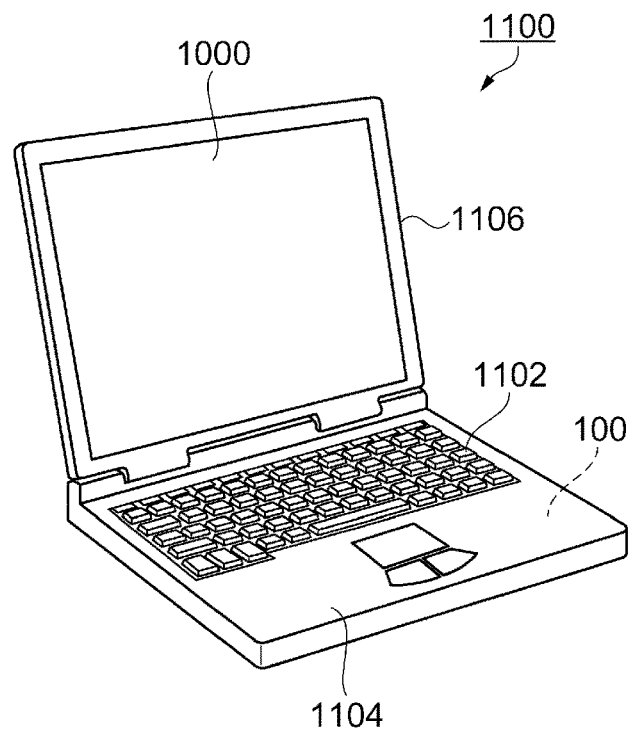
FIG. 9A is a perspective view illustrating a configuration of a mobile personal computer as an example of an electronic apparatus.

FIG. 9A is a perspective view illustrating a schematic configuration of a mobile type (or notebook type) personal computer as an electronic apparatus provided with the electronic device according to an embodiment of the invention. In this drawing, a personal computer 1100 includes a body portion 1104 including a keyboard 1102, and a display unit 1106 including a display portion 1000, and the display unit 1106 is supported rotatably with respect to the body portion 1104 via a hinge structure. The personal computer 1100 of this structure includes the physical quantity sensor 100 as an example of the electronic device which functions as a filter, a resonator, a reference clock or the like.

Figure 9B:
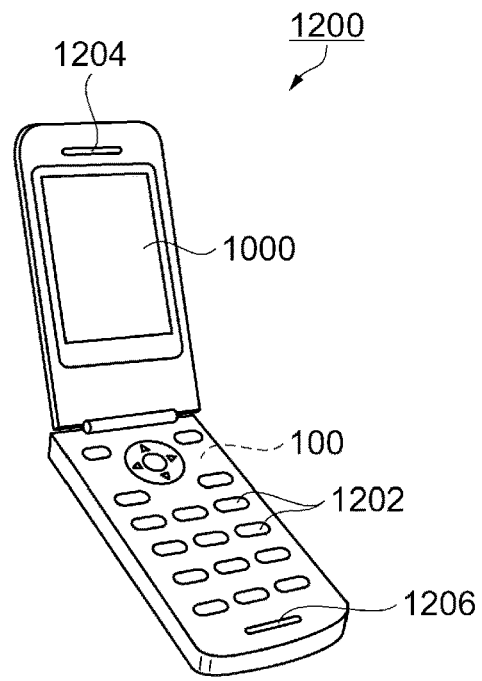
FIG. 9B is a perspective view illustrating a mobile phone as an example of the electronic apparatus.

FIG. 9B is a perspective view illustrating a schematic configuration of a mobile phone (PHS is also included) as an electronic apparatus provided with the electronic device according to the embodiment of the invention. In the drawing, the mobile phone 1200 includes a plurality of operating button 1202, an ear piece 1204, and a mouthpiece 1206, and a display portion 1000 is arranged between the operating button 1202 and the ear piece 1204. The mobile phone 1200 of this configuration includes the physical quantity sensor 100 as an example of the electronic device functioning as the filter, the resonator, and an angular speed sensor integrated therein.

Figure 10:
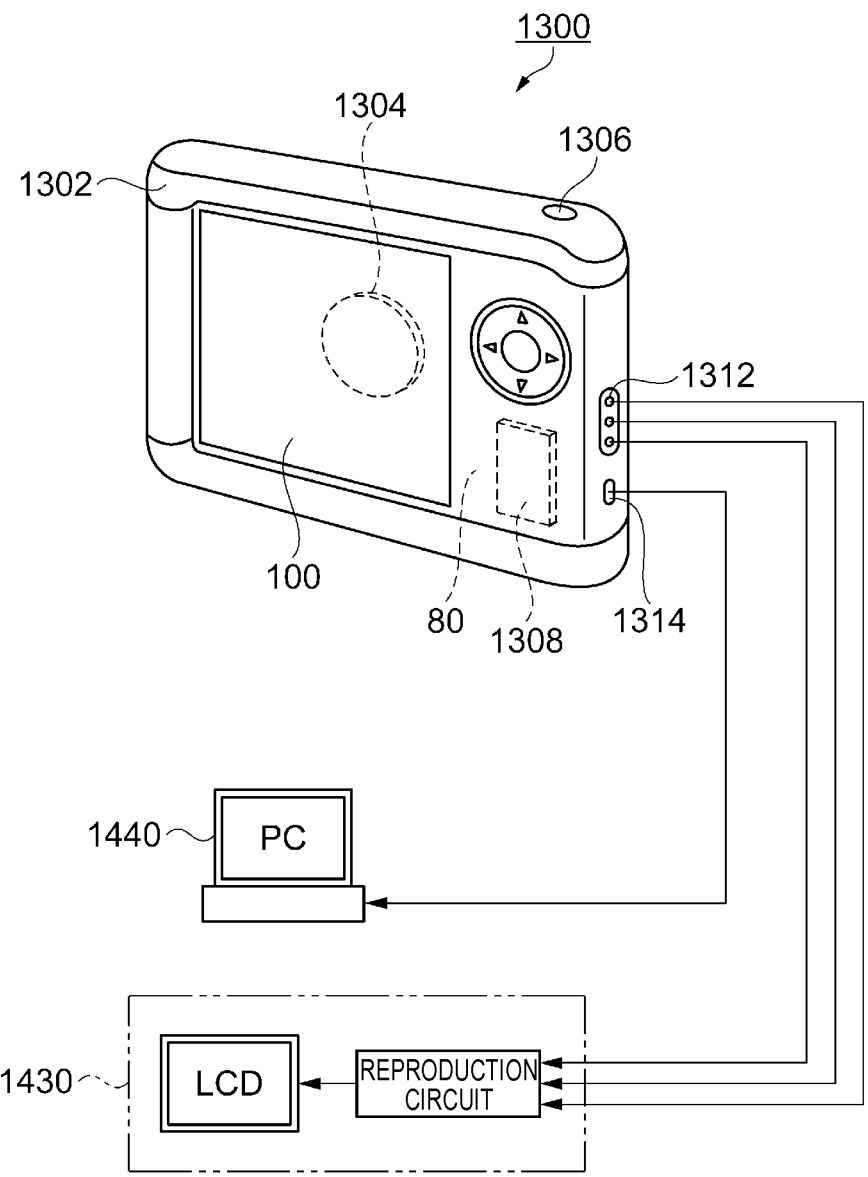
FIG. 10 is a perspective view illustrating a configuration of a digital still camera as an example of the electronic apparatus.

FIG. 10 is a perspective view illustrating a schematic configuration of a digital still camera as an electronic apparatus provided with the electronic device according to the embodiment of the invention. In this drawing, a connection with an external instrument is also illustrated in a simplified manner. A digital still camera 1300 performs photoelectric conversion on an optical image of an object to be photographed by an image pickup element such as a CCD (Charge Coupled Device) or the like and generates an image-pickup signal (image signal).

The display portion 1000 is provided on a back surface of a case (body) 1302 in the digital still camera 1300 for displaying an image on the basis of the image-pickup signal generated by the CCD, and the display portion 1000 functions as a finder that displays the object to be photographed as an electronic image. A light-receiving unit 1304 including an optical lens (image-pickup optical system) or a CCD is provided on the front side of the case 1302 (the back side in the drawing).

When a photographer confirms the object to be photographed displayed on the display portion 1000 and presses a shutter button 1306, an image-pickup signal from the CCD at that moment is transferred and stored in a memory 1308. In the digital still camera 1300 of this configuration, a video signal output terminal 1312 and an input/output terminal 1314 for data transmission are provided on the side surface of the case 1302. As illustrated in the drawing, a TV monitor 1430 is connected to the video signal output terminal 1312 and a personal computer 1440 is connected to the input/output terminal 1314 for data transmission as needed, respectively. Furthermore, the image pickup signal stored in the memory 1308 is output to the TV monitor 1430 and the personal computer 1440. In the digital still camera 1300 of this configuration includes the physical quantity sensor 100 as an example of the electronic device functioning as the filter, the resonator, and an angular speed sensor integrated therein.

As described above, with the provision of the physical quantity sensor 100 in which lowering of the detection accuracy is further restrained as the electronic apparatus, an electronic apparatus with higher operation accuracy may be provided.

The physical quantity sensor 100 according to the first embodiment of the invention may be applied to, in addition to the personal computer (mobile-type personal computer) in FIG. 9A, the mobile phone in FIG. 9B, and the digital still camera in FIG. 10, the electronic apparatus such as inkjet type discharging apparatus (for example, inkjet printers), laptop-type personal computers, TV sets, video cameras, car navigation apparatus, pagers, electronic notepads (including those with communication function), electronic dictionaries, calculators, electronic game apparatus, workstations, videophones, security TV monitors, electronic binocular telescopes, POS terminals, medical apparatus (for example, electronic thermometers, manometers, blood glucose meters, electrocardiographic measurement instruments, ultrasonic diagnosis apparatus, electronic endoscopes), fish detectors, various measurement instruments, instruments (for example, instruments for vehicles, aircrafts, ships), flight simulators, for example.

Moving Object

Subsequently, a moving object to which the physical quantity sensor 100 according to an embodiment of the invention is applied will be described with reference to FIG. 11. In the following explanation, an example in which the physical quantity sensor 100 is applied will be described. However, the physical quantity sensor may be one of the physical quantity sensors 1, 101, 102, 103, and 104.

Figure 11:
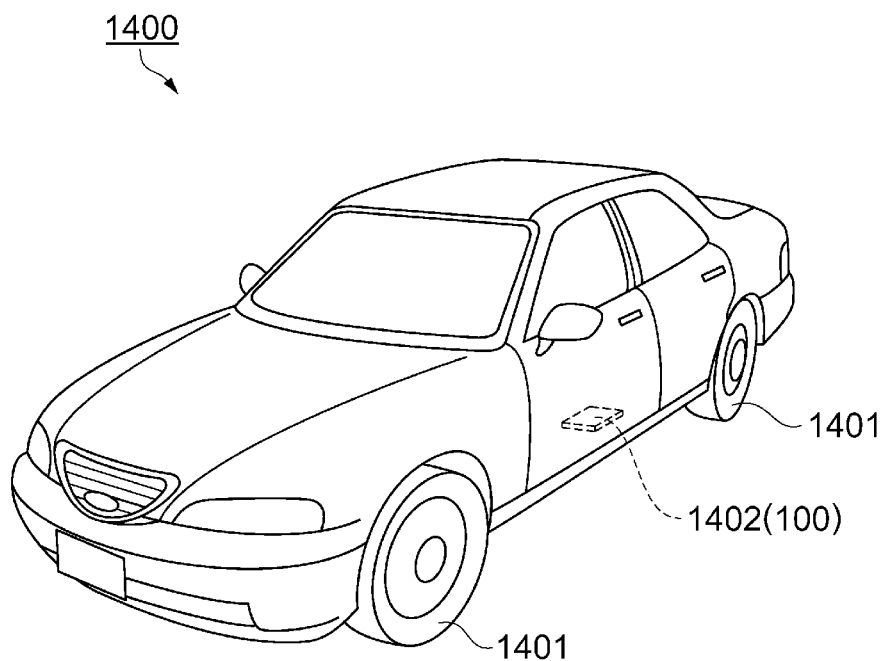
FIG. 11 is a perspective view schematically illustrating an automotive vehicle as an example of a moving object.

FIG. 11 is a perspective view schematically illustrating an automotive vehicle 1400 as a moving object provided with the physical quantity sensor 100. The automotive vehicle 1400 includes a gyrosensor including the physical quantity sensor 100 according to the invention mounted thereon. For example, as illustrated in the same drawing, the automotive vehicle 1400 as the moving object includes an electronic control unit 1402 having the gyrosensor configured to control a tire 1401 integrated therein. As another example, the physical quantity sensor 100 may be applied widely to electronic control unit (ECU) such as keyless entries, immobilizer, car navigation systems, car air-conditioning apparatus, anti-lock braking systems (ABS), airbags, tire-pressure monitoring systems (TPMS), engine controls, battery monitors for hybrid vehicles or electric vehicles, vehicle posture control systems, and the like.

As described above, with the provision of the physical quantity sensor 100 in which lowering of the detection accuracy is further restrained as the moving object, a moving object with more stable environment property such as the temperature change is provided.

The entire disclosures of Japanese Patent Applications 2013-143286 filed Jul. 9, 2013, 2014-088894 filed Apr. 23, 2014 and 2014-088898 filed Apr. 23, 2014 are expressly incorporated by reference herein.

What is claimed is:

1. An electronic device comprising:
   a substrate; and
   a first functional element disposed on the substrate and having a sensor and an outer edge,
   wherein the sensor includes all sensing portions, wiring, and electrodes for the first functional element, and the outer edge is defined by an imaginary line encircling the sensor having all sensing portions, wiring, and electrodes, the outer edge being the portion of the first functional element outside of the imaginary line in a plan view, and
   wherein the outer edge includes at least two separate first grooves formed spaced apart in a top surface of the outer edge of the first functional element, each of the first grooves being elongated in a first direction in the plan view, and each of the first grooves being vacant.

2. The electronic device according to claim 1,
   wherein the outer edge includes a second groove formed in the outer edge, the second groove is elongated in a second direction which intersects the first direction in the plan view, and the second groove is vacant.

3. The electronic device according to claim 1,
wherein the first functional element includes:
a fixed portion;
a supporting portion extending from the fixed portion; and
a movable portion supported by the supporting portion so as to be displaceable.

4. The electronic device according to claim 3,
wherein the first direction is a direction of displacement of the movable portion of the first functional element in the plan view.

5. The electronic device according to claim 1, further comprising:
a second functional element,
wherein the first groove is provided between a sensor of the first functional element and the second functional element.

6. The electronic device according to claim 1,
wherein the first functional element and the outer edge are formed of the same material.

7. The electronic device according to claim 1,
wherein the first groove and the second groove are arranged to form a figure which has rotational symmetry in the plan view.

8. The electronic device according to claim 1,
wherein the first groove penetrates completely through the outer edge in a thickness direction of the first functional element.

9. The electronic device according to claim 1,
wherein the outer edge has a fixed potential.

10. The electronic device according to claim 1,
wherein the outer edge includes at least two separate second grooves formed in the outer edge only on the outer periphery of the first functional element, each of the second grooves being elongated in a second direction which intersects the first direction in the plan view, and each of the second grooves being vacant,
the imaginary line including a first side, a second side, a third side, and a fourth side, the first side being opposite the third side and the second side being opposite the fourth side, and
the first direction is parallel to the first side and the third side of the imaginary line.

11. An electronic device comprising:
a substrate, and
a first functional element provided on a main surface of the substrate having a sensor and an outer edge,
wherein the sensor includes all sensing portions, wiring, and electrodes for the first functional element, and the outer edge is defined by an imaginary line encircling the sensor having all sensing portions, wiring, and electrodes, the outer edge being the portion of the first functional element outside of the imaginary line in a plan view, and
wherein at least two separate first grooves are formed spaced apart in a top surface of the outer edge of the first functional element, each of the first grooves being elongated in a first direction in the plan view, and each of the first grooves being vacant.

12. The electronic device according to claim 11, wherein a second groove is provided on at least one of the outer edge and the area of the substrate overlapping with the outer edge in the plan view, the second groove is elongated in a second direction which intersects the first direction in the plan view, and the second groove is vacant.

13. The electronic device according to claim 12, further comprising:
a second functional element provided on the main surface of the substrate, and
wherein at least one of the first groove and the second groove is provided between the first functional element and the second functional element.

14. The electronic device according to claim 11,
wherein the first functional element includes:
a fixed portion;
a supporting portion extending from the fixed portion; and
a movable portion supported by the supporting portion so as to be displaceable, and
wherein the fixed portion is fixed to the main surface of the substrate, and
the movable portion is supported so as to be separated from the substrate by the supporting portion so as to be displaceable.

15. A physical quantity sensor comprising:
a substrate; and
a first sensor element disposed on the substrate and having a sensor and an outer edge,
wherein the sensor includes all sensing portions, wiring, and electrodes for the first sensor element, and the outer edge is defined by an imaginary line encircling the sensor having all sensing portions, wiring, and electrodes, the outer edge being the outside of the imaginary line in a plan view, and
wherein the outer edge includes at least two separate first grooves formed spaced apart in a top surface of the outer edge, each of the first grooves being elongated in a first direction in the plan view, and each of the first grooves being vacant.

16. The physical quantity sensor according to claim 15,
wherein the outer edge includes a second groove formed in the outer edge, the second groove is elongated in a second direction which intersects the first direction in the plan view, and the second groove is vacant.

17. The physical quantity sensor according to claim 15, further comprising:
a second sensor element,
wherein at least one of the first groove and the second groove is provided between the first sensor element and the second sensor element.

18. The physical quantity sensor according to claim 15,
wherein the first sensor element is provided on a main surface of the substrate.

19. The physical quantity sensor according to claim 18, further comprising:
a second sensor element provided on the main surface of the substrate,
wherein the first groove is provided between the first sensor element and the second sensor element.

20. A method of manufacturing an electronic device comprising:
forming a depressed portion on a substrate;
joining a functional element substrate with the substrate so as to oppose the depressed portion and such that there is a gap between the functional element substrate and the depressed portion in the substrate; and
patterning the functional element substrate to form:
a substrate, and
a functional element disposed on the substrate and having a sensor and an outer edge,
wherein the sensor includes all sensing portions, wiring, and electrodes for the functional element, and the outer edge is defined by an imaginary line encircling the sensor having all sensing portions, wiring, and electrodes, the outer edge being the portion of the functional element outside of the imaginary line in a plan view, at least two separate first grooves in the outer edge only on the outer periphery of the first sensor element, each of the first grooves being elongated in a first direction, and each of the first grooves remaining vacant in the electronic device, and at least two separate second grooves in the outer edge only on the outer periphery of the sensor element, each of the second grooves being elongated in a second direction which intersects the first direction, and each of the second grooves remaining vacant in the electronic device.

* * * * *